(12) United States Patent
Kagotani et al.

(10) Patent No.: US 8,836,204 B2
(45) Date of Patent: Sep. 16, 2014

(54) ORGANIC EL ILLUMINATION DEVICE

(75) Inventors: Akihito Kagotani, Yonezawa (JP);
Makoto Arisawa, Yonezawa (JP);
Hideki Kamada, Yonezawa (JP)

(73) Assignee: Lumiotec Inc., Yamagata (JP)

( * ) Notice: Subject to any disclaimer, the term of this patent is extended or adjusted under 35 U.S.C. 154(b) by 100 days.

(21) Appl. No.: 13/643,955

(22) PCT Filed: Apr. 27, 2011

(86) PCT No.: PCT/JP2011/060239
§ 371 (c)(1),
(2), (4) Date: Dec. 20, 2012

(87) PCT Pub. No.: WO2011/136262
PCT Pub. Date: Nov. 3, 2011

(65) Prior Publication Data
US 2013/0093308 A1 Apr. 18, 2013

(30) Foreign Application Priority Data

Apr. 27, 2010 (JP) .................. 2010-101883
Apr. 27, 2010 (JP) .................. 2010-101884

(51) Int. Cl.
*H05B 33/06* (2006.01)
*H05B 33/04* (2006.01)
*H05B 33/02* (2006.01)
*H01L 51/52* (2006.01)
*B32B 17/10* (2006.01)
*F21V 29/00* (2006.01)
*F21Y 105/00* (2006.01)

(52) U.S. Cl.
CPC ............ *H05B 33/06* (2013.01); *H01L 51/529* (2013.01); *H01L 51/5253* (2013.01); *H01L 2251/5361* (2013.01); *B32B 17/10541* (2013.01); *H05B 33/02* (2013.01); *F21V 29/2206* (2013.01); *H05B 33/04* (2013.01); *H01L 51/5203* (2013.01); *F21Y 2105/006* (2013.01); *B32B 17/10036* (2013.01); *F21V 29/246* (2013.01); *H01L 51/524* (2013.01)
USPC .............. 313/45; 313/504; 313/505; 313/506

(58) Field of Classification Search
CPC ............................. H05B 33/06; H05B 33/02
USPC .................................................. 313/494–512
See application file for complete search history.

(56) References Cited

U.S. PATENT DOCUMENTS

2010/0213833 A1  8/2010  Kawachi et al.

FOREIGN PATENT DOCUMENTS

| JP | 2003-123990 A | 4/2003 |
|---|---|---|
| JP | 2005-50558 A | 2/2005 |
| JP | 2007-299740 A | 11/2007 |
| JP | 2008-107438 A | 5/2008 |
| JP | 2010-192822 A | 9/2010 |
| WO | WO 2008/062645 A1 | 5/2008 |

*Primary Examiner* — Anh Mai
*Assistant Examiner* — Elmito Breval
(74) *Attorney, Agent, or Firm* — Birch, Stewart, Kolasch & Birch, LLP

(57) ABSTRACT

Disclosed is an organic EL illumination device—which is provided with: an organic EL element (13) on a glass substrate (10); and a plurality of anode terminal electrodes (11) and cathode terminal electrodes (12) for evenly supplying current to the aforementioned organic EL element (13) on the aforementioned glass substrate (10)—wherein the organic EL illumination device is provided with a wiring board (1) to which a circuit having anode wiring (1*a*) corresponding to the position of each of the aforementioned anode terminal electrodes (11), and a circuit having cathode wiring (1*b*) corresponding to the position of each of the aforementioned cathode terminal electrodes (12) are formed.

13 Claims, 35 Drawing Sheets

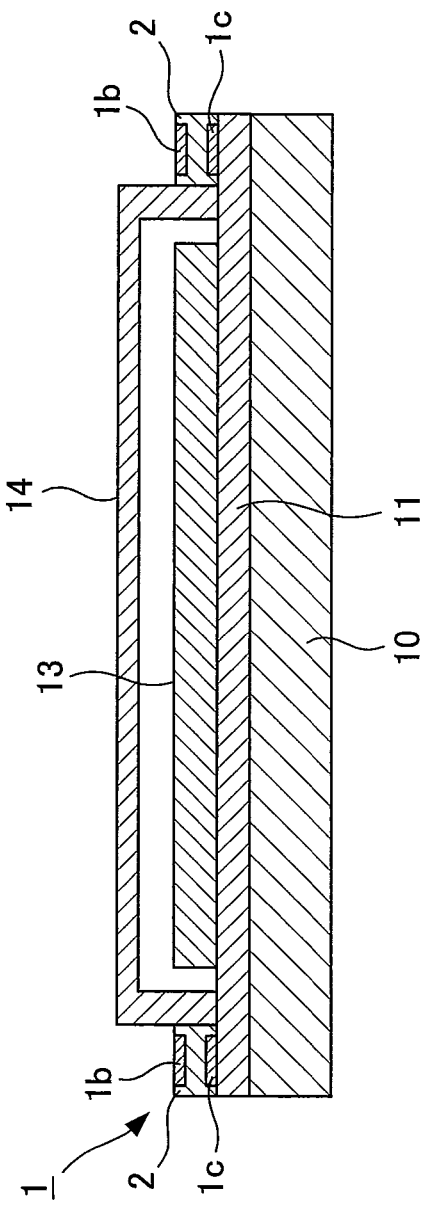

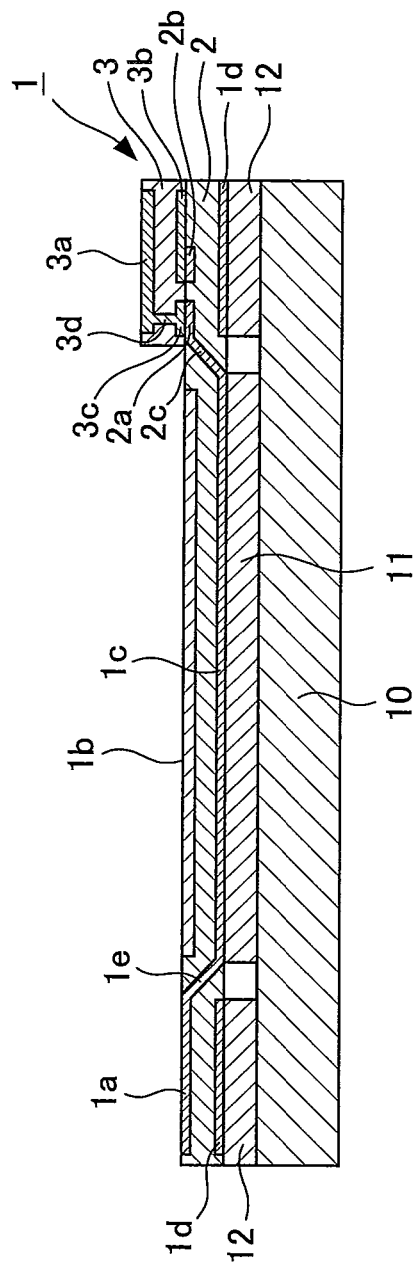

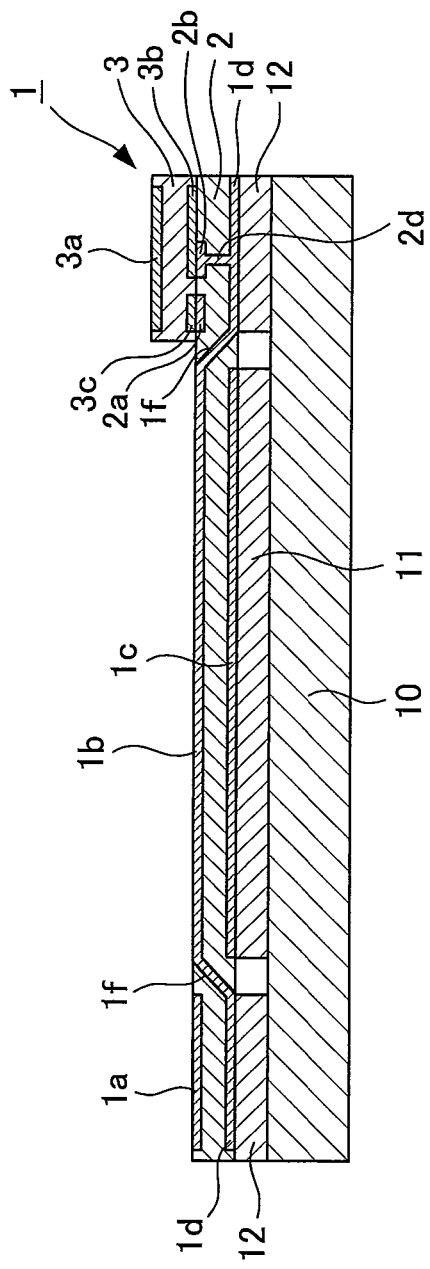

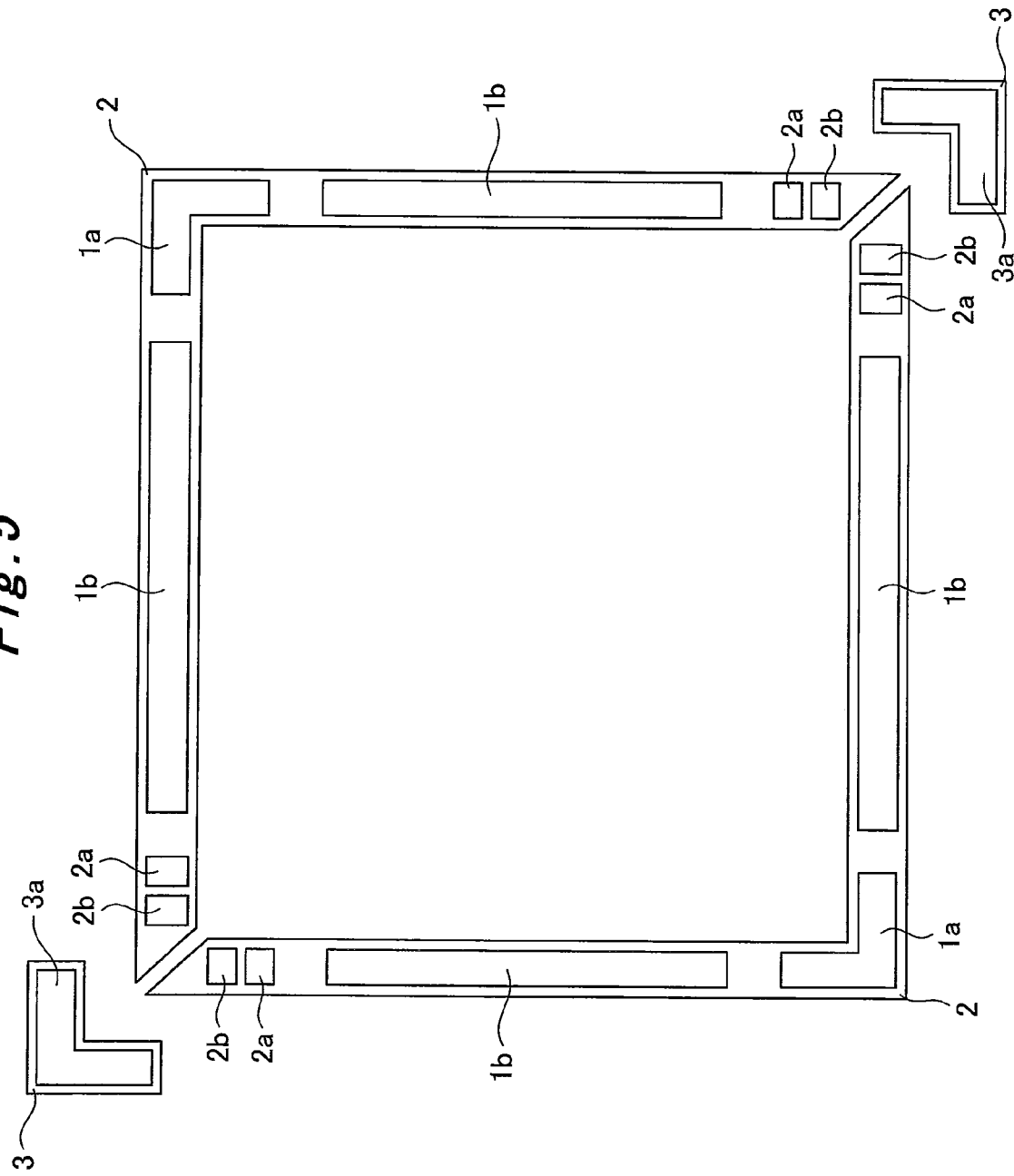

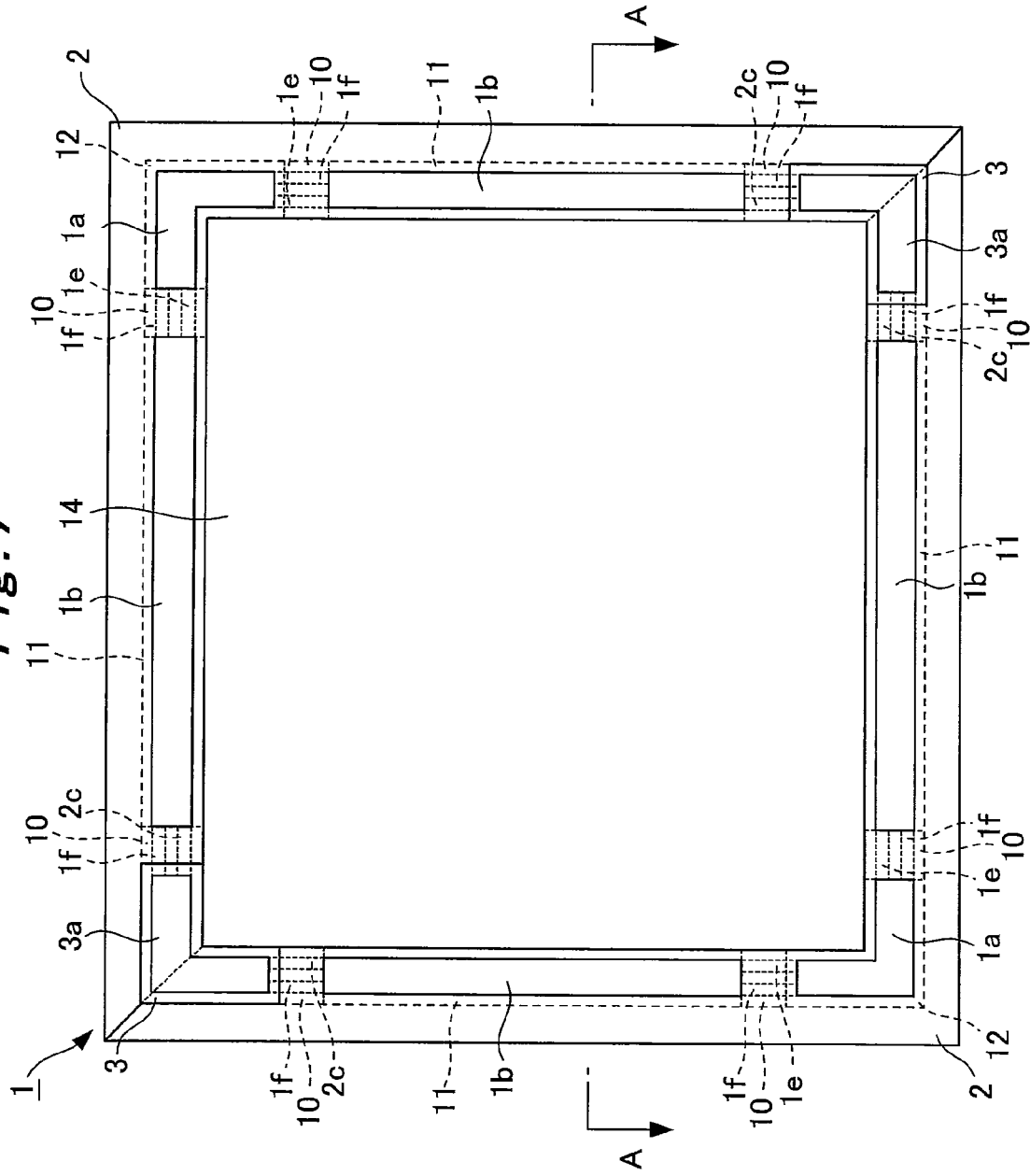

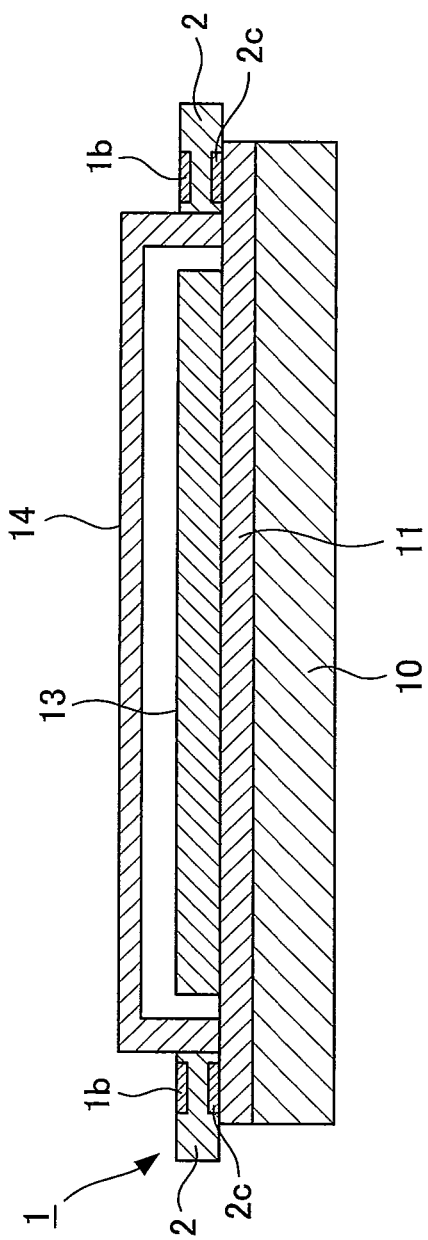

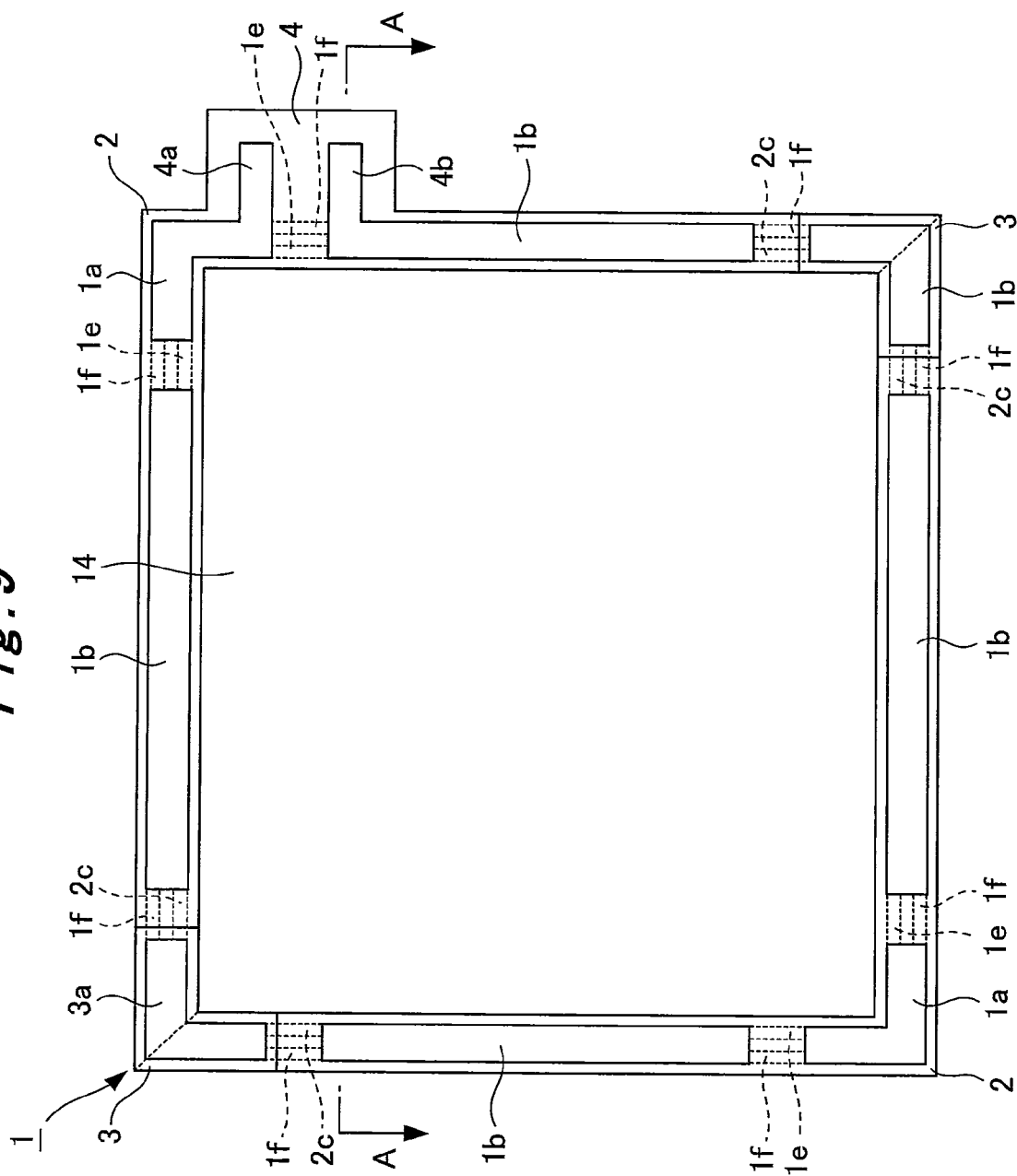

ORGANIC EL ILLUMINATION DEVICE

TECHNICAL FIELD

The present invention relates to an organic EL illumination device.

BACKGROUND ART

In a conventional organic electroluminescence (hereinafter, referred to as organic EL) illumination device, as shown in FIGS. 39 and 40, anode terminal electrodes 11 are formed respectively on four sides of a glass substrate 10 and cathode terminal electrodes 12 are formed respectively on four corners of the glass substrate 10 to make an organic EL illumination panel with a large area uniformly emit light. Moreover, entire surfaces of the anode terminal electrodes 11 and the cathode terminal electrodes 12 are covered with a solder (hereinafter, referred to as underlying solder) to reduce a wiring resistance.

Further, a current is evenly supplied to an organic EL element 13 from four directions through the anode terminal electrodes 11 and the cathode terminal electrodes 12.

In addition, a sealing can 14 for preventing performance deterioration of the organic EL element 13 due to oxygen, water, and the like is formed on the glass substrate 10 to cover the organic EL element 13.

Moreover, as shown in FIG. 41, the anode terminal electrodes 11 are connected to one another with anode lead wires 20 and the cathode terminal electrodes 12 are connected to one another with cathode lead wires 21 by using a soldering method.

Further, as shown in FIG. 42, an anode lead-out wire 22 is connected to one of the anode terminal electrodes 11 and a cathode lead-out wire 23 is connected to one of the cathode terminal electrodes 12. A connector 24 is attached to end portions of the anode lead-out wire 22 and the cathode lead-out wire 23. The current is supplied to the organic EL element 13 from the connector 24.

Patent Document 1 listed below discloses an organic EL illumination device with the following characteristics as an example of the conventional organic EL illumination device. In an organic EL element including at least a transparent anode layer, an organic light-emitting medium layer, and a cathode layer, an auxiliary electrode layer is provided which is stacked on the cathode layer with an insulating layer in between and which is in contact with the transparent anode layer.

Moreover, Patent Document 2 discloses an organic EL illumination device with the following characteristics as an example of the conventional organic EL illumination device. An insulating protective film which protects an organic EL element from oxygen and water is formed. A conductive film covering an upper electrode with the protective film securing insulation between the conductive film and the upper electrode has one portion connected to a connection terminal of a lower electrode or an end portion of the lower electrode on a side closer to the connection terminal and has another portion connected to an end portion of the lower electrode on an opposite side from the connection terminal. The conductive film is formed of a metal film and is formed on an insulating film.

In Patent Documents 1 and 2, an auxiliary electrode which reduces a wiring resistance is formed only on one side of the transparent electrode made of indium tin oxide (hereinafter, referred to as ITO) or the like with high resistance.

PRIOR ART DOCUMENTS

Patent Documents

Patent Document 1: Japanese Patent Application Publication No. 2003-123990
Patent Document 2: Japanese Patent Application Publication No. 2005-50558

SUMMARY OF THE INVENTION

Problems to be Solved by the Invention

In the conventional organic EL illumination device described above, the four anode terminal electrodes 11 and the four cathode terminal electrodes 12 are connected with the lead wires by using the soldering method. However, the work of connecting the four anode terminal electrodes 11 and the four cathode terminal electrodes 12 with the lead wires by using the soldering method requires very high skill and it is thus difficult to achieve automation of this connection work. Accordingly, it is difficult to improve the productivity.

Moreover, ultrasonic soldering is used for soldering because the solder does not adhere well onto the anode terminal electrodes 11 and the cathode terminal electrodes 12 formed on the glass substrate 10. At this time, the glass substrate 10 may be chipped due to ultrasonic soldering.

Furthermore, a large current needs to be applied to drive the organic EL illumination panel with a large area at a high luminance. However, in the conventional organic EL illumination device, since the current is supplied from one portion, the lead wires need to be made considerably thick to supply the large current to the four anode terminal electrodes 11 and the four cathode terminal electrodes 12. For example, a lead wire having an external diameter of 1.3 mm $\phi$ needs to be disposed for each of the set of anode terminal electrodes 11 and the set of cathode terminal electrodes 12 to make a current of 1.5 A flow. Accordingly, it is difficult to make the organic EL illumination device thin and a frame thereof narrow.

Moreover, in the conventional organic EL illumination device, the organic EL illumination panel is manufactured as follows. A large glass substrate is cut by scribing or breaking to obtain a desired panel size and the underlying solder is then formed on the entire surfaces of the anode terminal electrodes 11 and the cathode terminal electrodes 12. Accordingly, cut surfaces in four end portions of the glass substrate 10 are sharp and the underlying solder may be exposed or be protruding out. Hence, there is a safety problem that a person may be injured by having his/her hand cut or receive an electric shock when holding the organic EL illumination device.

Furthermore, in the conventional organic EL illumination device, the resistance is reduced by forming the protective film on the cathode, stacking the auxiliary electrode wiring and the like on the entire surface of the cathode, and connecting the end portions of the auxiliary electrode wiring with the anode ITO. Hence, when a conductive foreign object or the like exists on the protective film, the protective film is destroyed and the possibility of short circuit between the cathode and the anode ITO becomes very high. Particularly, in an organic EL illumination panel with a large electrode area, use of a thin protective film significantly increases the possibility of short circuit between the cathode and the anode ITO and is a major reason for decrease in yield.

In view of these problems, an object of the present invention is to provide an organic EL illumination device which is designed to enable automation of a connection work and thus improve productivity.

Means for Solving the Problems

An organic EL illumination device according to a first invention to solve the above-described problems is an organic EL illumination device including an organic EL element, a plurality of anode terminal electrodes, and a plurality of cathode terminal electrodes on a glass substrate, the anode terminal electrodes and the cathode terminal electrodes used to evenly supply a current to the organic EL element, characterized in that the organic EL illumination device comprises a wiring board in which a circuit having anode electrodes corresponding to positions of the respective anode terminal electrodes and a circuit having cathode electrodes corresponding to positions of the respective cathode terminal electrodes are formed.

An organic EL illumination device according to a second invention to solve the above-described problems is the organic EL illumination device according to the first invention, characterized in that the wiring board is formed to surround part or an entirety of the organic EL element.

An organic EL illumination device according to a third invention to solve the above-described problems is the organic EL illumination device according to the second invention, characterized in that the organic EL illumination device further comprises a plate for uniform heat distribution and radiation on a back surface thereof, and an outer periphery of the plate for uniform heat distribution and radiation is larger than an outer periphery of the glass substrate.

An organic EL illumination device according to a fourth invention to solve the above-described problems is the organic EL illumination device according to the second invention, characterized in that an outer periphery of the wiring board is larger than an outer periphery of the glass substrate.

An organic EL illumination device according to a fifth invention to solve the above-described problems is the organic EL illumination device according to the second invention, characterized in that a power supply terminal portion for supplying a current to the wiring board is formed.

An organic EL illumination device according to a sixth invention to solve the above-described problems is the organic EL illumination device according to the second invention, characterized in that a resin frame is placed around the substrate.

An organic EL illumination device according to a seventh invention to solve the above-described problems is the organic EL illumination device according to the first invention, characterized in that the wiring board includes: an anode flexible printed circuit board in which a circuit having electrodes corresponding to positions of the respective anode terminal electrodes is formed; and a cathode flexible printed circuit board in which a circuit having electrodes corresponding to positions of the respective cathode terminal electrodes is formed.

An organic EL illumination device according to an eighth invention to solve the above-described problems is the organic EL illumination device according to the seventh invention, characterized in that a side surface and a back-surface end portion of the glass substrate is covered with an insulating film.

An organic EL illumination device according to a ninth invention to solve the above-described problems is the organic EL illumination device according to the seventh invention, characterized in that a power supply terminal portion for supplying a current to the anode flexible printed circuit board and the cathode flexible printed circuit board is formed.

An organic EL illumination device according to a tenth invention to solve the above-described problems is the organic EL illumination device according to the seventh invention, characterized in that the organic EL illumination device further comprises a plate for uniform heat distribution and radiation on a back surface thereof.

An organic EL illumination device according to an eleventh invention to solve the above-described problems is the organic EL illumination device according to any one of the inventions 1 to 10, characterized in that the organic EL element is sealed with a sealing can.

An organic EL illumination device according to a twelfth invention to solve the above-described problems is the organic EL illumination device according to any one of the inventions 1 to 10, characterized in that the organic EL element is sealed with a sealing glass substrate.

An organic EL illumination device according to a thirteenth invention to solve the above-described problems is the organic EL illumination device according to any one of the inventions 1 to 10, characterized in that the organic EL element is sealed with a sealing film.

Effect of the Invention

The present invention provides an organic EL illumination device which is designed to enable automation of a connection work and thus improve productivity.

BRIEF DESCRIPTION OF THE DRAWINGS

FIG. 2 is a cross-sectional view taken along the line A-A in FIG. 1.

FIG. 3 is a cross-sectional view taken along the line B-B in FIG. 1.

FIG. 4 is a cross-sectional view taken along the line C-C in FIG. 1.

FIG. 5 is a schematic view showing a configuration of a wiring board in the organic EL illumination device according to the first embodiment of the present invention.

FIG. 7 is a plan view of an organic EL illumination device according to a second embodiment of the present invention.

FIG. 8 is a cross-sectional view taken along the line A-A in FIG. 7.

FIG. 9 is a plan view of an organic EL illumination device according to a third embodiment of the present invention.

MODES FOR CARRYING OUT THE INVENTION

Description is given below of embodiment modes of an organic EL illumination device according to the present invention with reference to the drawings.

Embodiment 1

Description is given below of an organic EL illumination device according to a first embodiment of the present invention.

First, an overview of the configuration of the organic EL illumination device according to the embodiment is described.

Figure 39:
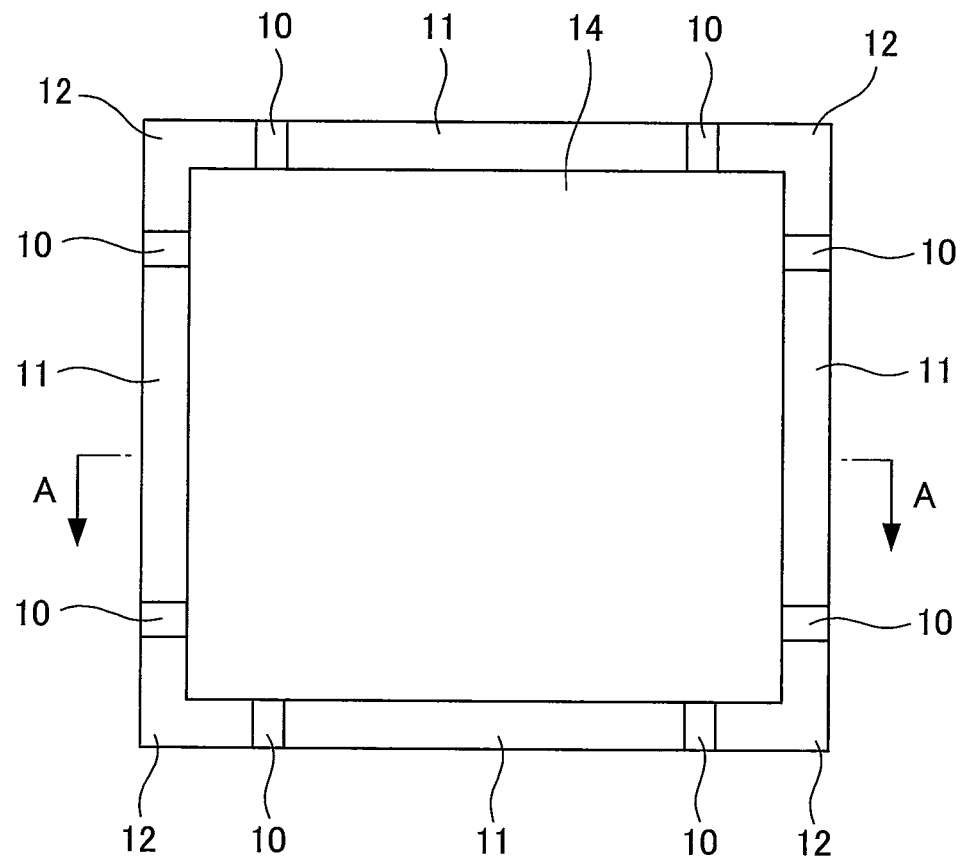
FIG. 39 is a plan view of a conventional organic EL illumination device.
Figure 40:
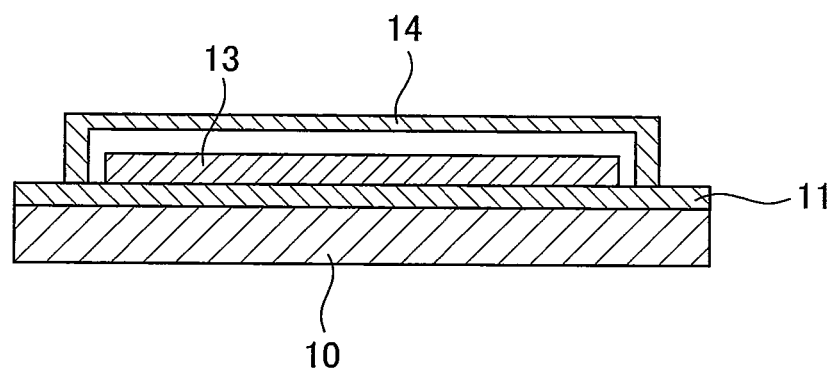
FIG. 40 is a cross-sectional view taken along the line A-A in FIG. 39.
Figure 41:
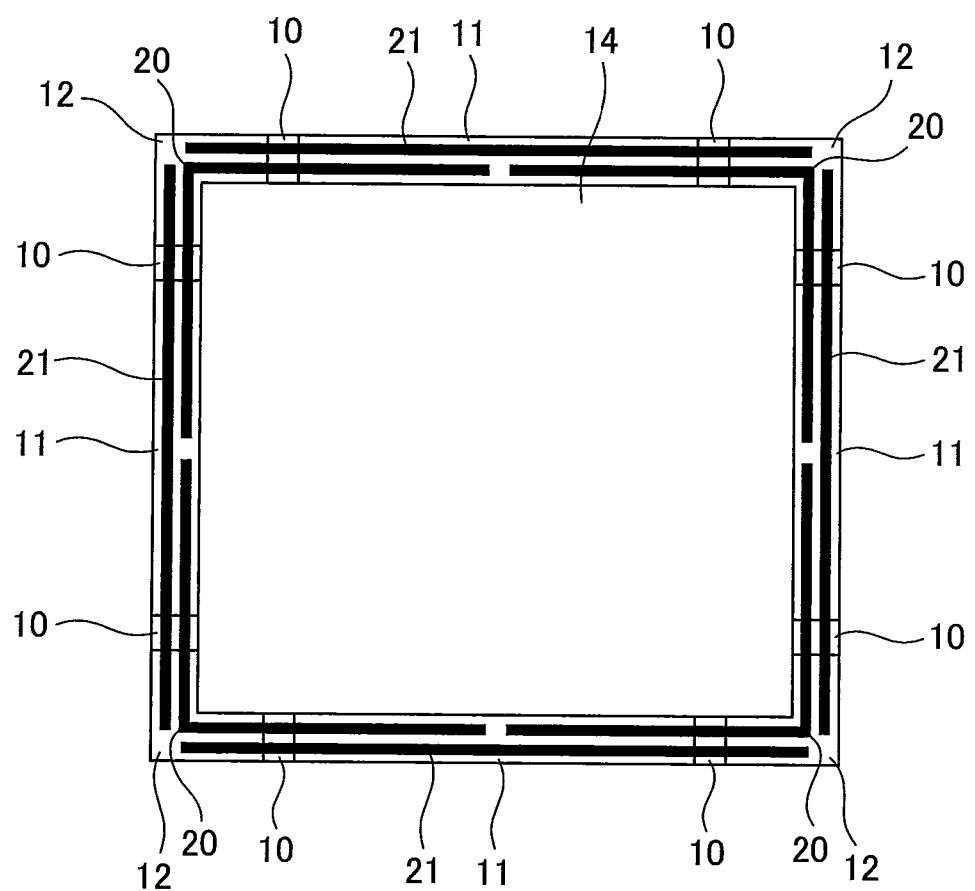
FIG. 41 is a plan view showing a wiring connection method using lead wires in the conventional organic EL illumination device.

Like the conventional organic EL illumination device, the organic EL illumination device according to the embodiment includes: anode terminal electrodes 11 which are provided respectively on the four sides of a glass substrate 10 shown in FIGS. 39 and 40; cathode terminal electrodes 12 which are provided respectively on the four corners of the glass substrate 10; and a sealing can 14 for preventing performance degradation of the organic EL element 13 due to oxygen, water and the like, the sealing can provided on the glass substrate 10 to cover an organic EL element 13. Although the glass substrate 10 is used as a substrate in the embodiment, it is possible to use a substrate made of a material such as a plastic, a metal, or a ceramic.

Figure 1:
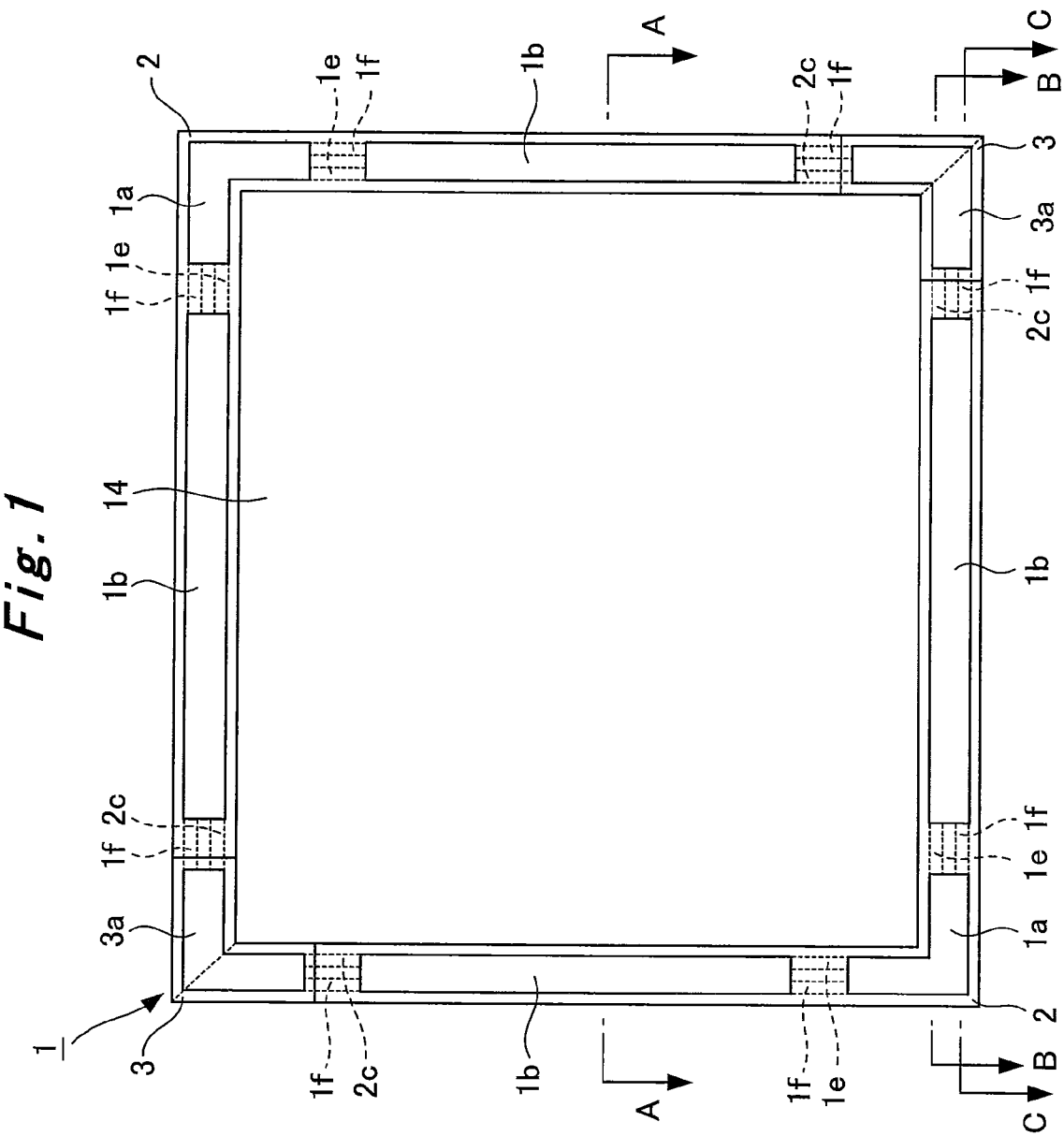
FIG. 1 is a plan view of an organic EL illumination device according to a first embodiment of the present invention.

FIG. 1 is a plan view of the organic EL illumination device according to the embodiment. FIG. 2 is a cross-sectional view taken along the line A-A in FIG. 1. FIG. 3 is a cross-sectional view taken along the line B-B in FIG. 1. FIG. 4 is a cross-sectional view taken along the line C-C in FIG. 1. Although omitted in FIGS. 1 to 4, power supply terminal portions are actually formed.

As shown in FIG. 1, the organic EL illumination device according to the embodiment includes a frame-shaped wiring board 1 in which anode wirings 1a for evenly supplying power to the four anode terminal electrodes 11 and cathode wirings 1b for evenly supplying power to the four cathode terminal electrodes 12 are formed. In the embodiment, the wiring board 1 is mounted to surround the sealing can 14.

In the embodiment, the wiring board 1 is formed of multiple parts and the specific configuration thereof is described later in detail. Moreover, in the embodiment, the wiring board 1 is made of a glass epoxy board or a flexible printed wiring board. Further, in the embodiment, the thickness of the wiring board 1 is about 0.2 mm to 0.5 mm.

As shown in FIGS. 2 to 4, anode electrodes 1c connected to the anode terminal electrodes 11 are formed on the four sides of a back surface of the wiring board 1, at positions corresponding to the anode terminal electrodes 11, respectively. Moreover, cathode electrodes 1d connected to the cathode terminal electrodes 12 are formed on the four corners of the back surface of the wiring board 1, at positions corresponding to the cathode terminal electrodes 12, respectively.

In the embodiment, an anisotropic conductive film (hereinafter, referred to as ACF) is attached or an anisotropic conductive paste (hereinafter, referred to as ACP) is applied to the anode electrodes 1c and the cathode electrodes 1d. Then, the wiring board 1 is attached to the glass substrate 10 and is subjected to thermo compression bonding. The anode electrodes 1c and the anode terminal electrodes 11 as well as the cathode electrodes 1d and the cathode terminal electrodes 12 are thereby electrically connected together.

As shown in FIGS. 1 and 3, the anode wirings 1a and the anode electrodes 1c are connected by anode connecting wirings 1e running through through-holes. Moreover, as shown in FIGS. 1 and 4, the cathode wirings 1b and the cathode electrodes 1d are connected by cathode connection wirings 1f running through through-holes. Accordingly, the wiring board 1 forms a circuit for each of a positive current and a negative current with no short circuit.

In the embodiment, the organic EL illumination device includes four anode terminal electrodes 11 and four cathode terminal electrodes 12 to evenly supply a current to the organic EL element 13 formed in a rectangular shape. Accordingly, four anode electrodes 1c and four cathode electrodes 1d are formed in the wiring board 1. However, when the organic EL illumination device includes three anode terminal electrodes 11 and three cathode terminal electrodes 12 to evenly supply a current to the organic EL element 13 formed in a triangular shape for example, three anode electrodes 1c and three cathode electrodes 1d may be formed in the wiring board 1.

Moreover, when the organic EL illumination device includes five or more anode terminal electrodes 11 and five or more cathode terminal electrodes 12 to evenly supply a current to the organic EL element 13 formed in a polygonal shape whose number of sides is equal to or more than that of a pentagon, five or more anode electrodes 1c and five or more cathode electrodes 1d may be formed in the wiring board 1.

Next, description is given of the configuration of the wiring board 1 in the organic EL illumination device according to the embodiment.

FIG. 5 is a schematic view showing the configuration of the wiring board 1 in the organic EL illumination device according to the embodiment.

As shown in FIG. 5, the wiring board 1 in the organic EL illumination device according to the embodiment is formed of: two L-shaped wiring boards 2 having an L-shape; and two L-shaped connection wiring boards 3 having an L-shape and used to connect the two L-shaped wiring boards 2 having an L-shape. An anode electrode 2a and a cathode electrode 2b are formed on each of end portions of front surfaces of the L-shaped wiring boards 2.

As shown in FIG. 3, the anode electrodes 1c and the anode electrodes 2a are connected by anode connecting wirings 2c running through through-holes. As shown in FIG. 4, the cathode electrodes 1d and the cathode electrodes 2b are connected by cathode connecting wirings 2d running through through-holes.

In the embodiment, the wiring board 1 is formed in a hollow square shape by combining the two L-shaped wiring boards 2 and the two L-shaped connection wiring boards 3. However, the wiring board 1 is not limited to this configuration and a wiring board formed in the hollow square shape from the beginning may be used. Moreover, the shape of the wiring board 1 is not limited to the hollow square shape and may be a squared-U shape, a V-shape, or the like. The wiring board 1 may be formed to completely or partially surround the organic EL element as necessary.

Figure 6A:
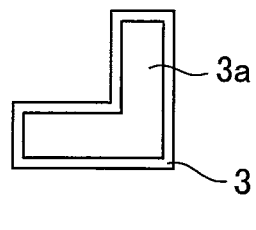
FIG. 6 includes schematic views showing a structure of L-shaped connection wiring boards in the organic EL illumination device of the first embodiment of the present invention.
Figure 6B:
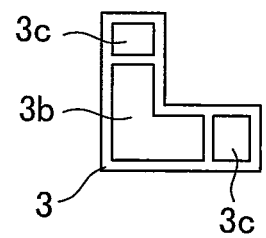

FIG. 6 includes schematic views showing the structure of the L-shaped connection wiring boards 3 in the organic EL illumination device according to the embodiment. Part (a) of FIG. 6 is a schematic view showing the structure of the L-shaped connection wiring boards 3 on a front surface side, and Part (b) of FIG. 6 is a schematic view showing the structure of the L-shaped connection wiring boards 3 on a back surface side.

As shown in Part (a) of FIG. 6, an anode wirings 3a is formed on the front surface side of each L-shaped connection wiring board 3. Moreover, as shown in Part (b) of FIG. 6, a cathode wiring electrode 3b and anode electrodes 3c are formed on the back surface side of each L-shaped connection wiring board 3. As shown in FIG. 3, the anode wirings 3a and the anode electrodes 3c are connected by anode connecting wirings 3d running though through-holes.

As shown in FIGS. 1, 3, and 4, the anode electrodes 2a and the anode electrodes 3c as well as the cathode electrodes 2b and the cathode wiring electrodes 3b are connected by soldering.

Although the anode electrodes 2a and the anode electrodes 3c as well as the cathode electrodes 2b and the cathode wiring electrodes 3b are connected by soldering in the embodiment, they may be connected by thermo compression bonding using ACF or ACP.

Although the anode wirings 1a, the cathode wirings 1b, and the anode wirings 3a are illustrated in an exposed state in FIGS. 1 to 6 to simply the illustration, it is preferable to cover these parts as necessary with a non-electrically conductive material to avoid short circuit and an electric shock.

In the conventional organic EL illumination device, connection of the four anode terminal electrodes 11 and the four cathode terminal electrodes 12 requires connection of total of eight lead wires, i.e., four for the anode terminal electrodes 11 and four for the cathode terminal electrodes 12. This connection work is performed with a soldering iron by hand work at 16 portions at ends of the eight lead wires.

On the other hand, in the organic EL illumination device of the embodiment, the wiring board 1 is used for wiring. Hence, after ACF is attached or ACP is applied by using an automatic compression bonding machine, wiring can be achieved by use of the wiring board 1. Accordingly, the yield and the productivity can be improved.

Further, in the conventional organic EL illumination device, the following method is used to reduce a wiring resistance and unevenness of luminance. A top of the upper electrode in contact with the organic EL element is covered with a thin insulating sheet (for example 100 nm to 1000 nm) and an insulating film with a conductive sheet is formed on the insulating sheet. However, since the insulting sheet is thin, short circuit occurs due to a conductive foreign object or the like and this reduces the yield.

On the other hand, in the organic EL illumination device of the embodiment, the wiring board 1 is used to run the wiring around the sealing can 14. Accordingly, no short circuit occurs between the wiring and electrodes formed in the organic EL element 13 and the yield can be thus drastically improved.

Moreover, in the conventional case, soldering needs to be performed by ultrasonic soldering. However, in the organic EL illumination device of the embodiment, connection is performed by thereto compression bonding using ACF or ACP. Hence, the glass substrate 10 is prevented from being chipped by ultrasonic soldering.

Moreover, in the organic EL illumination device of the embodiment, the thin wiring board 1 is used. This allows the thickness of an organic EL illumination panel to be made smaller than that of the conventional ones.

Embodiment 2

Description is given below of an organic EL illumination device according to a second embodiment of the present invention.

FIG. 7 is a plan view of the organic EL illumination device according to the embodiment. FIG. 8 is a cross-sectional view taken along the line A-A in FIG. 7.

The structure of the organic EL illumination device according to the embodiment is almost the same as the structure of the organic EL illumination device according to the first embodiment but, as shown in FIGS. 7 and 8, is different in that the size of a wiring board 1 is enlarged. This can prevent a worker from directly touching anode terminal electrodes 11, cathode terminal electrodes 12, and end surfaces of a glass substrate 10 with his/her hand. In the embodiment, an outer periphery of the wiring board 1 is made larger than an outer periphery of the glass substrate 10 by 0.5 mm to 3.0 mm.

In a wiring connection method of the conventional organic EL illumination device in which soldering using lead wires is performed, the anode terminal electrodes 11, the cathode terminal electrodes 12, lead wire connection portions, end surfaces of the glass substrate 10, and the like are exposed. Hence, there is a safety problem that a worker may be injured by having his/her hand cut or receive an electric shock when holding the organic EL illumination device.

Meanwhile, the organic EL illumination device of the embodiment has the following effect in addition to the effects of the organic EL illumination device according to the first embodiment. The enlarged wiring board 1 can prevent the worker from directly touching the anode terminal electrodes 11, the cathode terminal electrodes 12, the end surfaces of the glass substrate 10, and the like with his/her hand. Accordingly, the safety can be improved.

Moreover, the end surfaces of the glass substrate 10 can be protected from an external impact by enlarging the size of the wiring board 1.

Embodiment 3

Description is given below of an organic EL illumination device according to a third embodiment of the present invention.

Figure 10:
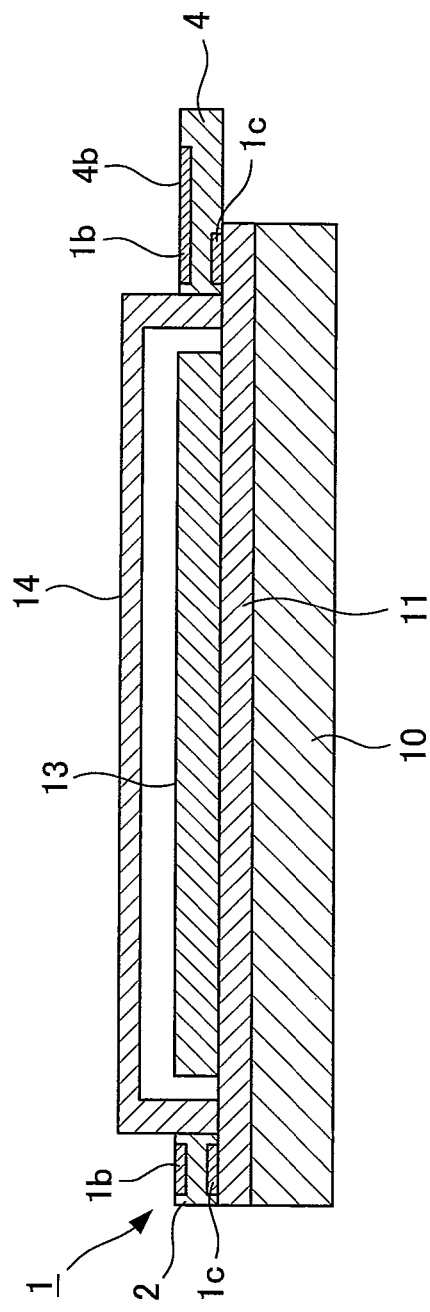
FIG. 10 is a cross-sectional view taken along the line A-A in FIG. 9.

FIG. 9 is a plan view of the organic EL illumination device according to the embodiment. FIG. 10 is a cross-sectional view taken along the line A-A in FIG. 9. Although omitted in FIGS. 9 and 10, a connector is actually attached to the organic EL illumination device.

Figure 42:
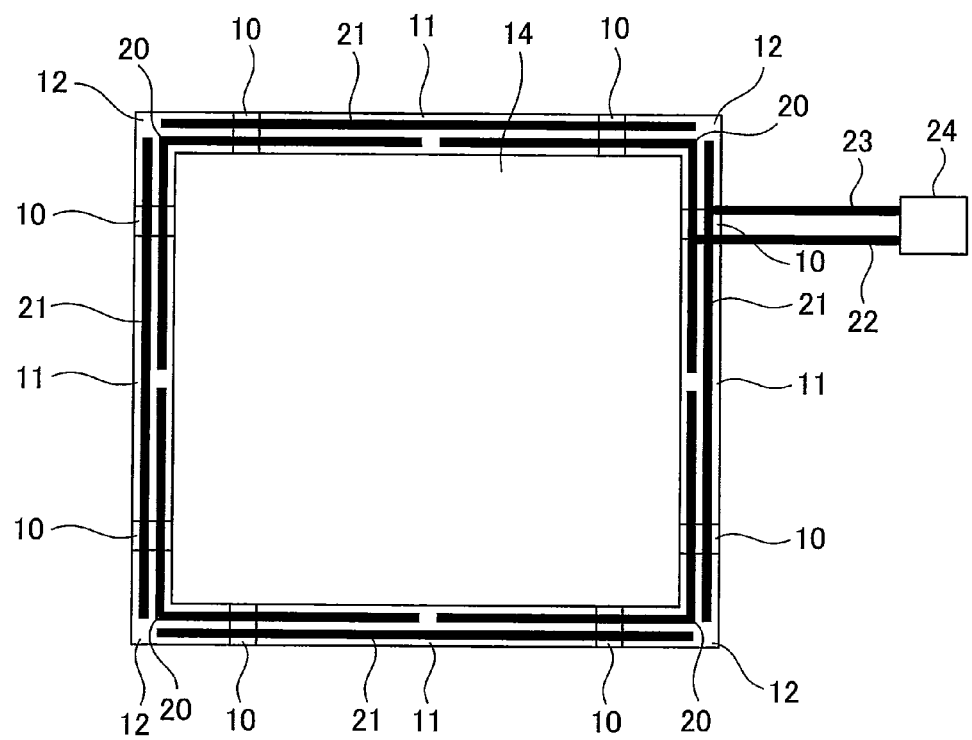
FIG. 42 is a plan view showing a power supply terminal lead-out method using lead wires in the conventional organic EL illumination device.

The structure of the organic EL illumination device according to the embodiment is almost the same as the structure of the organic EL illumination device according to the first embodiment, but is different in the following point. As shown in FIGS. 9 and 10, a protruding portion 4 is formed in a wiring board 1. Moreover, in the protruding portion 4, there are formed an anode power supply terminal portion 4a protruding from one of anode wirings 1a and a cathode power supply terminal portion 4b protruding from one of cathode wirings 1b. This allows a connector 24 to be connected directly to the anode power supply terminal portion 4a and the cathode power supply terminal portion 4b without using the anode lead-out wire 22 and the cathode lead-out wire 23 which are illustrated in FIG. 42.

Although anode wirings 1a, cathode wirings 1b, anode wirings 3a, the anode power supply terminal portion 4a, and the cathode power supply terminal portion 4b are illustrated in an exposed state in FIGS. 9 and 10 to simplify the illustration, it is preferable to cover these parts as necessary with a non-electrically conductive material to avoid short circuit and an electric shock.

Assume a case in the conventional organic EL illumination device where lead wires having an external diameter of 1.3 mm φ are lead out respectively from one of the four anode terminal electrodes 11 and one of the four cathode terminal electrodes 12. In this case, when the height of the sealing can 14 is 1 mm or less, the lead wires protrude by 0.3 mm or more and the organic EL illumination device thus cannot be made sufficiently thin.

Meanwhile, the organic EL illumination device of the embodiment has the following effect in addition to the effects of the organic EL illumination device according to the first embodiment. The lead wires can be omitted by forming the protruding portion 4 in the wiring board 1 and then forming the anode power supply terminal portion 4a protruding from the corresponding anode wirings 1a and the cathode power supply terminal portion 4b protruding from the corresponding cathode wiring 1b in the protruding portion 4. Hence, it is possible to make the organic EL illumination device thin and a frame thereof narrow. Moreover, since easy connection using the connector 24 can be performed, it is possible to improve productivity and simplify manufacturing steps.

Embodiment 4

Description is given below of an organic EL illumination device according to a fourth embodiment of the present invention.

Figure 11:
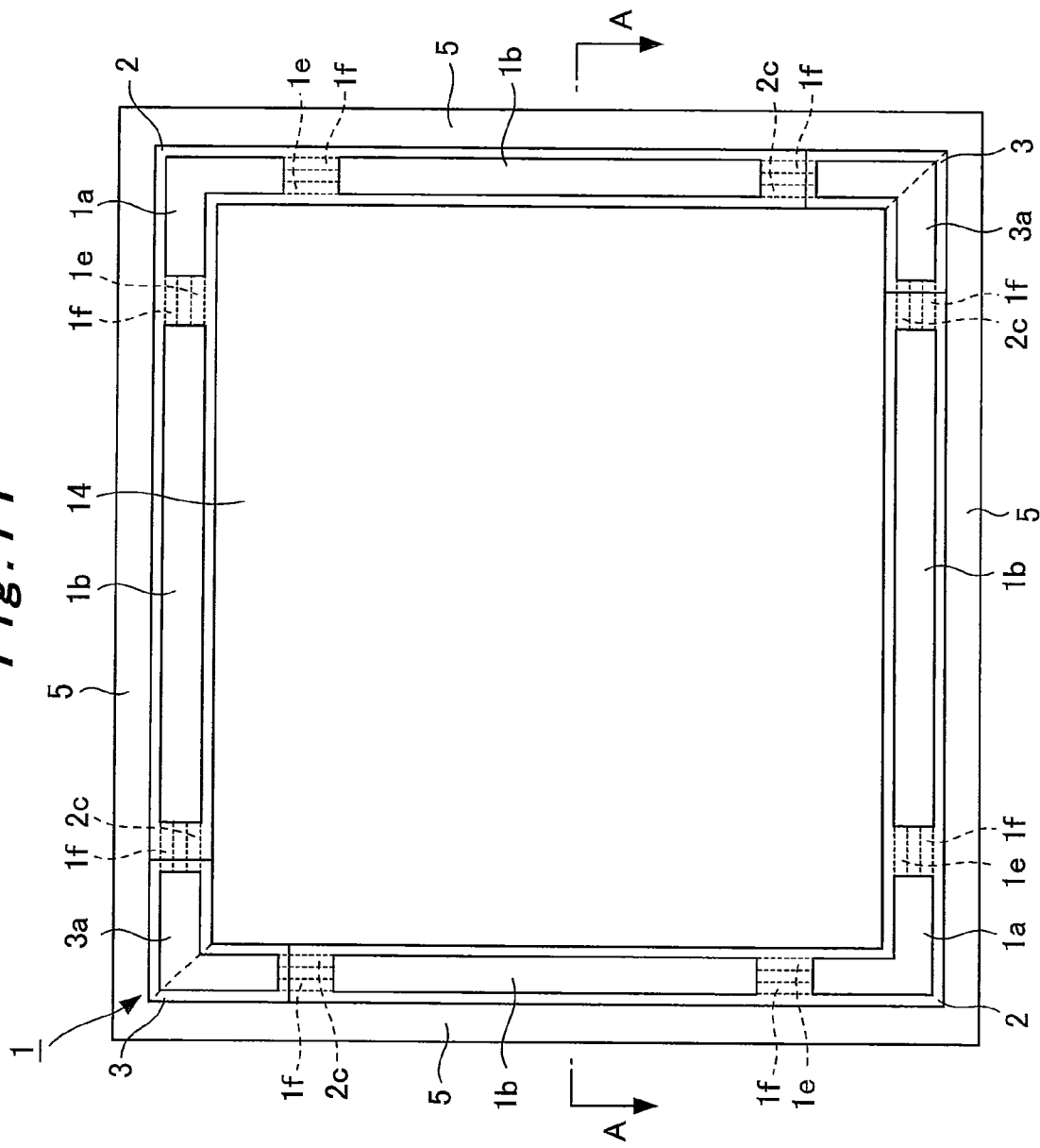
FIG. 11 is a plan view of an organic EL illumination device according to a fourth embodiment of the present invention.
Figure 12:
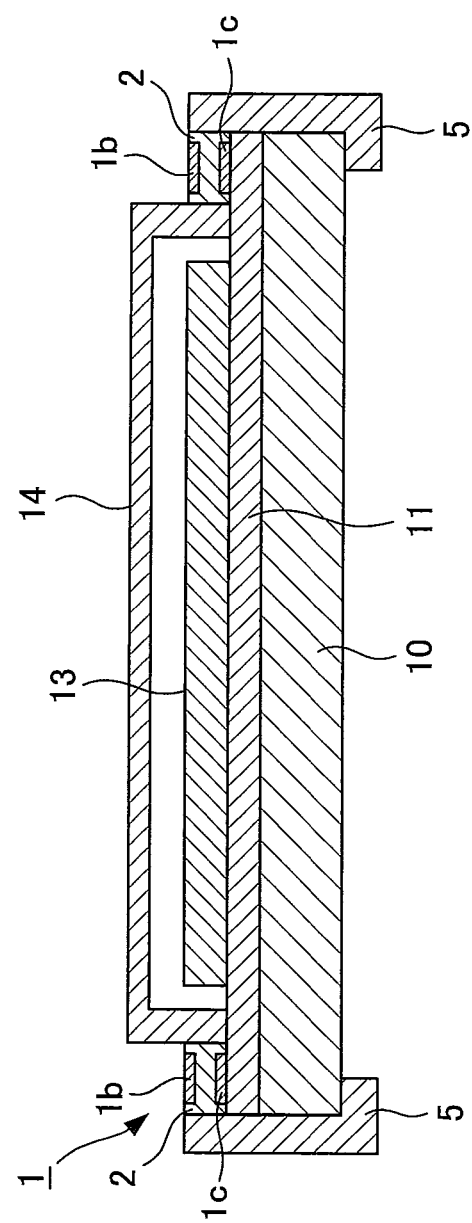
FIG. 12 is a cross-sectional view taken along the line A-A in FIG. 11.

FIG. 11 is a plan view of the organic EL illumination device according to the embodiment. FIG. 12 is a cross-sectional view taken along the line A-A in FIG. 11. Although omitted in FIGS. 11 and 12, power supply terminal portions are actually formed.

The structure of the organic EL illumination device according to the embodiment is almost the same as the structure of the organic EL illumination device according to the first embodiment but, as shown in FIGS. 11 and 12, is different in that a resin frame 5 is provided around a glass substrate 10. This can prevent a worker from directly touching anode terminal electrodes 11, cathode terminal electrodes 12, end surfaces of a glass substrate 10, and the like with his/her hand.

Although ABS is used as a material of the resin frame 5 in the embodiment, PET or PCV may be used instead. Moreover, although the resin frame 5 is attached to the glass substrate 10 by using an acrylic double-sided tape in the embodiment, the resin frame 5 may be attached by applying an adhesive.

In a wiring connection method of the conventional organic EL illumination device in which soldering using lead wires is performed, the anode terminal electrodes 11, the cathode terminal electrodes 12, the lead wire connection portions, the end surfaces of the glass substrate 10, and the like are exposed. Hence, there is a safety problem that a worker may be injured by having his/her hand cut or receive an electric shock when holding the organic EL illumination device.

Meanwhile, the organic EL illumination device of the embodiment has the following effect in addition to the effects of the organic EL illumination device according to the first embodiment. The resin frame 5 can prevent the worker from directly touching the anode terminal electrodes 11, the cathode terminal electrodes 12, the end surfaces of the glass substrate 10, and the like with his/her hand. Accordingly, the safety can be improved.

Moreover, the end surfaces of the glass substrate 10 can be protected from an external impact by providing the resin frame 5.

Embodiment 5

Description is given below of an organic EL illumination device according to a fifth embodiment of the present invention.

Figure 13:
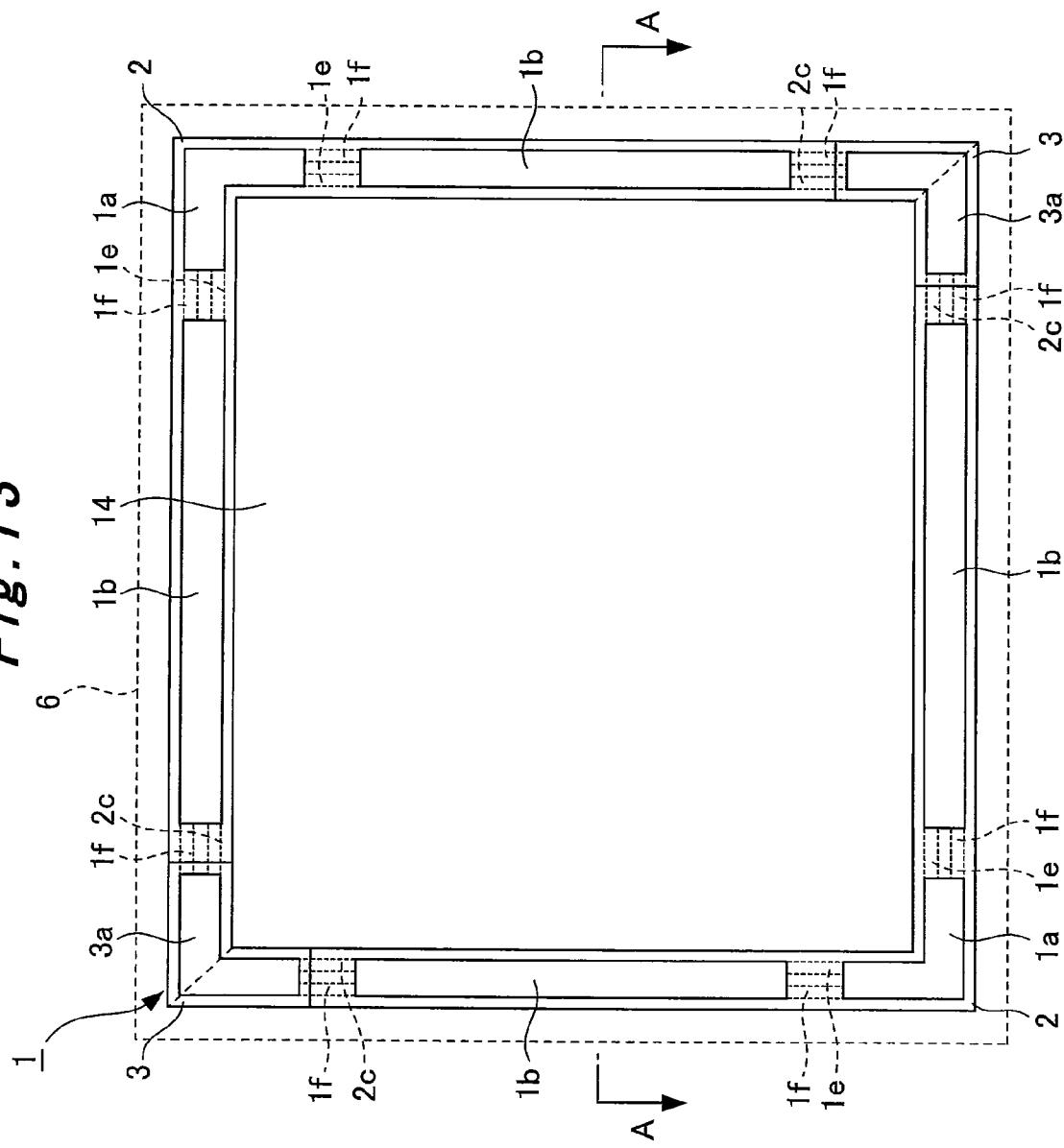
FIG. 13 is a plan view of an organic EL illumination device according to a fifth embodiment of the present invention.
Figure 14:
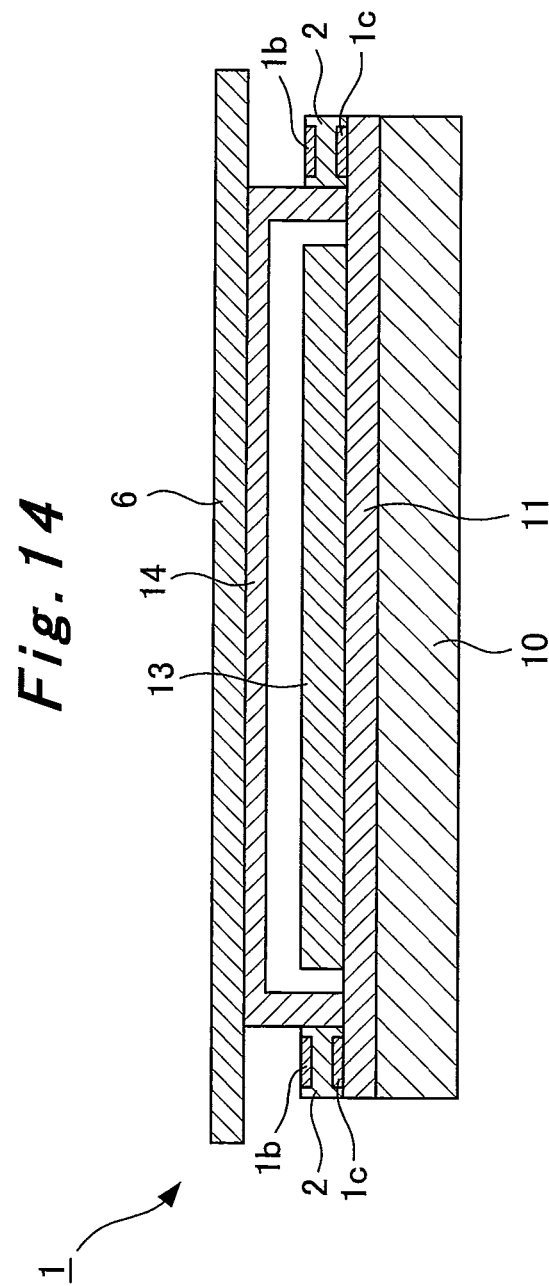
FIG. 14 is a cross-sectional view taken along the line A-A in FIG. 13.

FIG. 13 is a plan view of the organic EL illumination device according to the embodiment. FIG. 14 is a cross-sectional view taken along the line A-A in FIG. 13. Although omitted in FIGS. 13 and 14, power supply terminal portions are actually formed.

The structure of the organic EL illumination device according to the embodiment is almost the same as the structure of the organic EL illumination device according to the first embodiment but, as shown in FIGS. 13 and 14, is different in that a plate 6 for uniform heat distribution and radiation is installed on an upper portion of a sealing can 14. In the embodiment, a material with good thermal conductivity such as aluminum, copper, ceramic, graphite sheet, or the like is used as the material of the plate 6 for uniform heat distribution and radiation. However, other materials with good thermal conductivity can be used.

Moreover, in the embodiment, the plate 6 for uniform heat distribution and radiation on the upper portion of the sealing can 14 has a single layer structure. However, the plate 6 for uniform heat distribution and radiation may have a multilayer structure. In the case of employing the multplayer structure, the layers are attached together by using an acrylic resin film, a thermosetting epoxy resin film, or a liquid adhesive.

The organic EL illumination device according to the embodiment thus has the following effect in addition to the effects of the organic EL illumination device according to the first embodiment. Heat generated in an organic EL element 13 is uniformly distributed and uniform distribution of the heat in the entire organic EL element 13 is achieved. This improves the light emission distribution in a surface of the organic EL element 13.

In a wiring connection method of the conventional organic EL illumination device in which soldering using lead wires is performed, the anode terminal electrodes 11, the cathode terminal electrodes 12, the lead wire connection portions, the end surfaces of the glass substrate 10, and the like are exposed. Hence, there is a safety problem that a worker may be injured by having his/her hand cut or receive an electric shock when holding the organic EL illumination device.

In view of this, as shown in FIGS. 13 and 14, an outer periphery of the plate 6 for uniform heat distribution and radiation is formed to be larger than an outer periphery of the glass substrate 10 in the embodiment. Note that the plate 6 for uniform heat distribution and radiation is illustrated by a broken line in FIG. 13.

The organic EL illumination device of the embodiment thus has the following effect in addition to the effects of the organic EL illumination device according to the first embodiment. The plate 6 for uniform heat distribution and radiation can prevent the worker from directly touching the anode terminal electrodes 11, the cathode terminal electrodes 12, the end surfaces of the glass substrate 10, and the like with his/her hand. Accordingly, the safety can be improved.

In addition, the end surfaces of the glass substrate 10 can be protected from an external impact by providing the plate 6 for uniform heat distribution and radiation.

Embodiment 6

Description is given below of an organic EL illumination device according to a sixth embodiment of the present invention.

Figure 15:
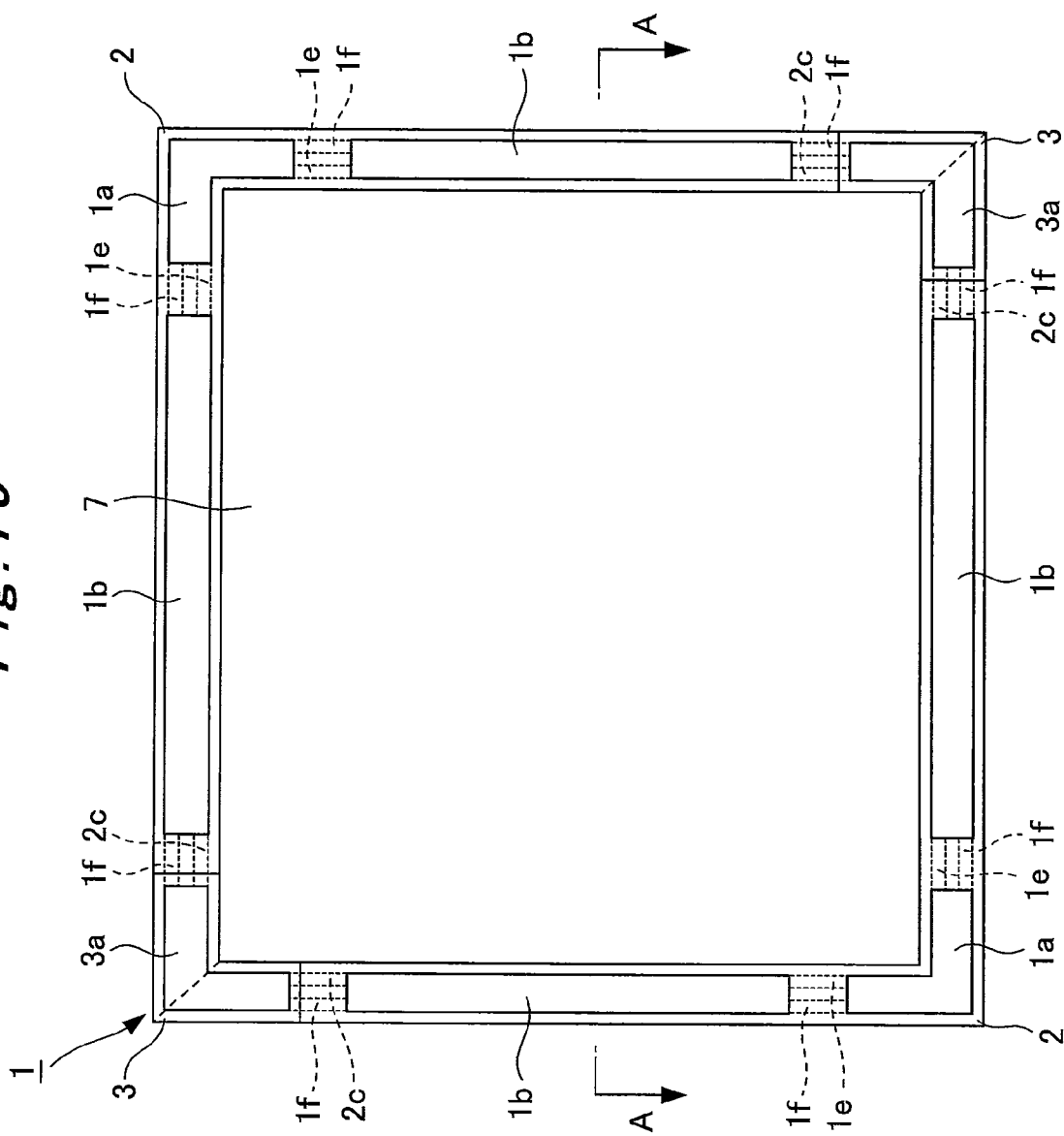
FIG. 15 is a plan view of an organic EL illumination device according to a sixth embodiment of the present invention.
Figure 16:
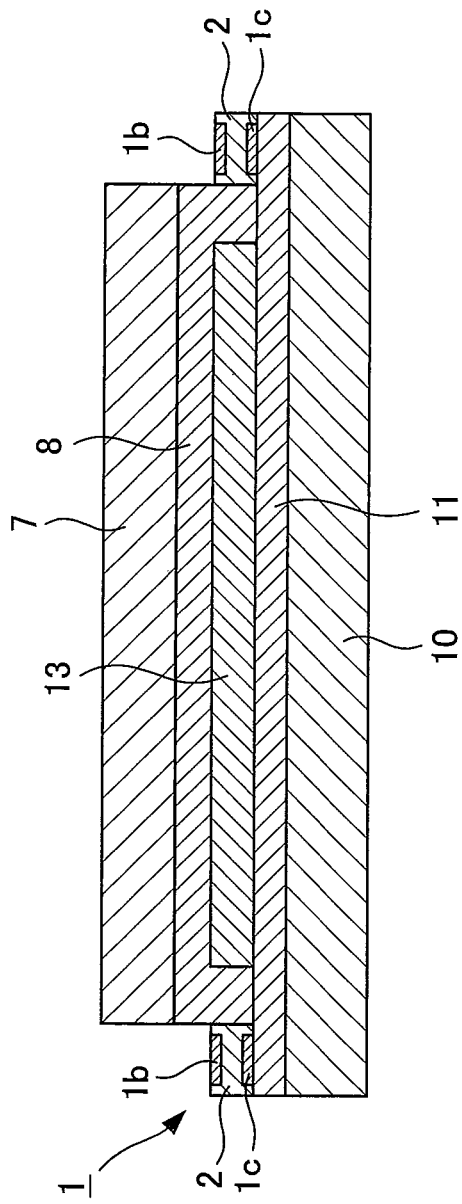
FIG. 16 is a cross-sectional view taken along the line A-A in FIG. 15.

FIG. 15 is a plan view of the organic EL illumination device according to the embodiment. FIG. 16 is a cross-sectional view taken along the line A-A in FIG. 15. Although omitted in FIGS. 15 and 16, power supply terminal portions are actually formed.

The structure of the organic EL illumination device according to the embodiment is almost the same as the structure of the organic EL illumination device according to the first embodiment but is different in the following point. As shown in FIGS. 15 and 16, instead of the sealing can 14, a sealing glass substrate 7 for preventing performance deterioration of an organic EL element 13 due to oxygen, water, and the like is bonded to a glass substrate 10 with an adhesive layer 8 and the organic EL element 13 is thus sealed.

In the embodiment, a solid seal using a resin for the adhesive layer 8 is employed as an example. However, a gel seal using gels for the adhesive layer 8 may be employed. In the case of the gel seal, the glass substrate 10 and the sealing glass substrate 7 have to be fixed together with an adhesive to prevent the gels from flowing out. Moreover, although the sealing glass substrate 7 is used as a sealing substrate in the embodiment, a substrate made of a material such as a plastic, metal, ceramic, or the like can be also used as the sealing substrate.

In addition to the effects of the organic EL illumination device according to the first embodiment, the organic EL illumination device according to the embodiment thus has such an effect that the thickness of an organic EL illumination panel can be made smaller.

Embodiment 7

Description is given below of an organic EL illumination device according to a seventh embodiment of the present invention.

Figure 17:
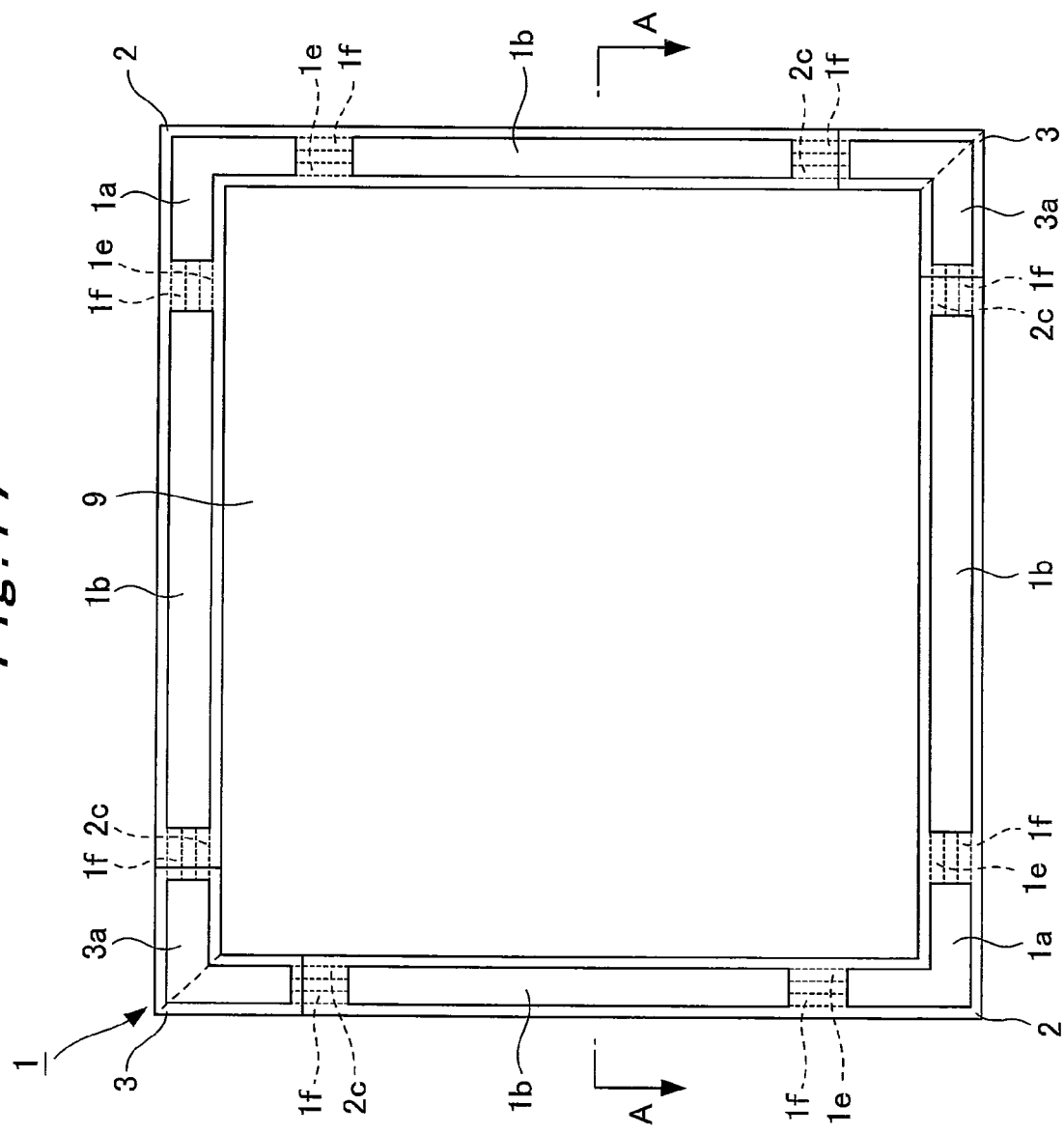
FIG. 17 is a plan view of an organic EL illumination device according to a seventh embodiment of the present invention.
Figure 18:
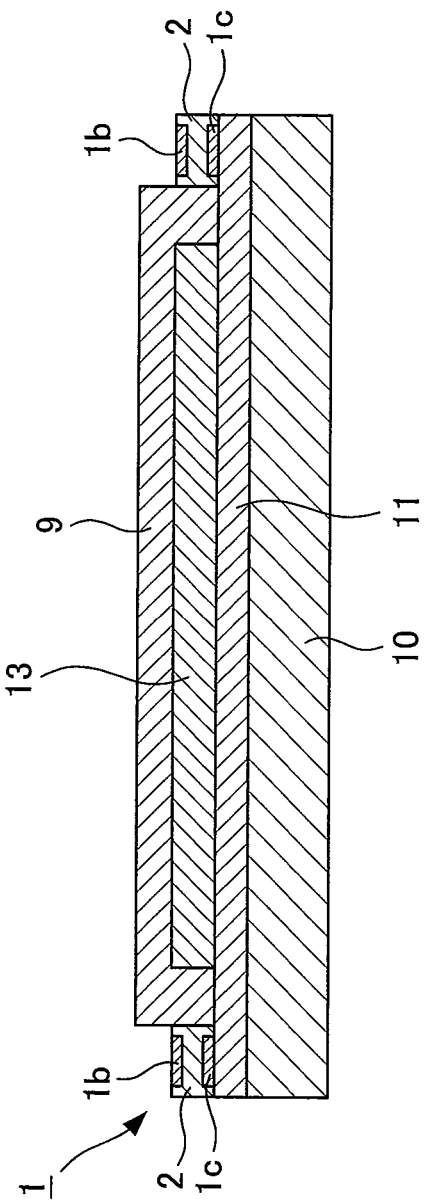
FIG. 18 is a cross-sectional view taken along the line A-A in FIG. 17.

FIG. 17 is a plan view of the organic EL illumination device according to the embodiment. FIG. 18 is a cross-sectional view taken along the line A-A in FIG. 17. Although omitted in FIGS. 17 and 18, power supply terminal portions are actually formed.

The structure of the organic EL illumination device according to the embodiment is almost the same as the structure of the organic EL illumination device according to the first embodiment but is different in the following point. As shown in FIGS. 17 and 18, a sealing film 9 for preventing performance deterioration of an organic EL element 13 due to oxygen, water, and the like is formed instead of the sealing can 14. In the embodiment, the sealing film 9 is made of a polyimide film of about 10 μm and an adhesive of about 20 μm.

In addition to the effects of the organic EL illumination device according to the first embodiment, the organic EL illumination device according to the embodiment thus has such an effect that the thickness of an organic EL illumination panel can be made smaller.

Embodiment 8

Description is given below of an organic EL illumination device according to an eighth embodiment of the present invention.

Figure 19:
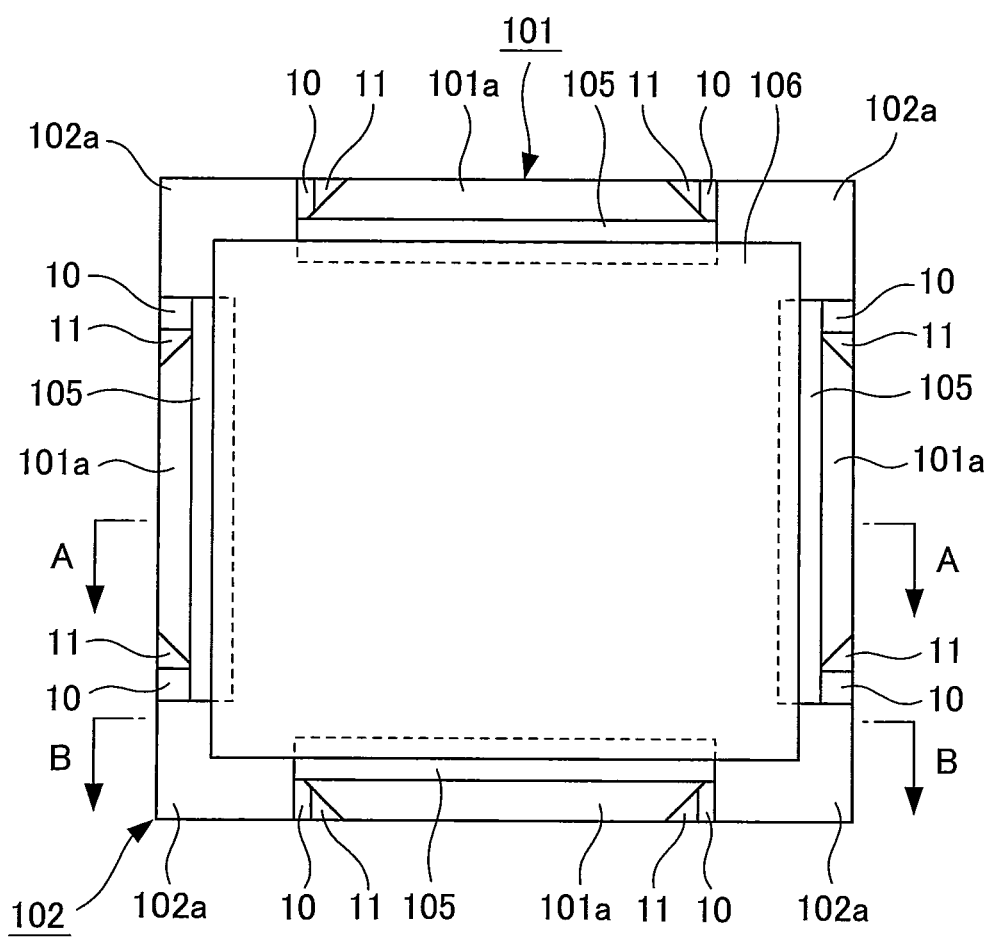
FIG. 19 is a plan view of an organic EL illumination device according to an eighth embodiment of the present invention.
Figure 20:
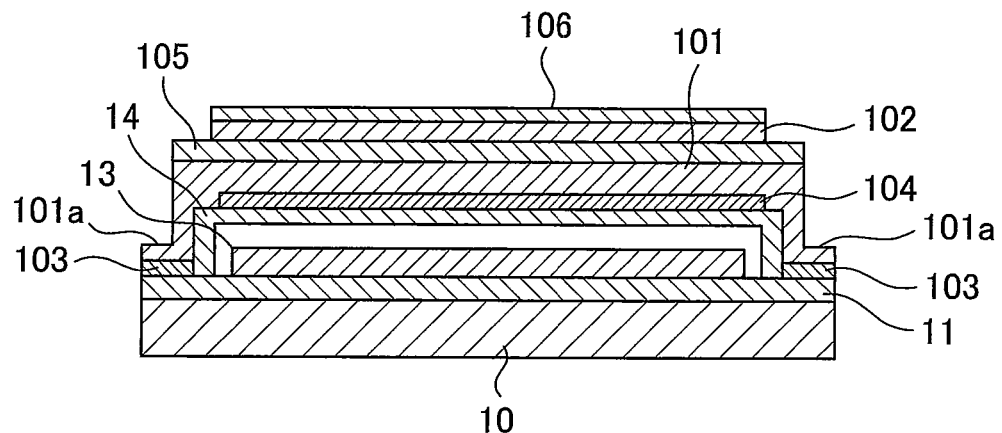
FIG. 20 is a cross-sectional view taken along the line A-A in FIG. 19.
Figure 21:
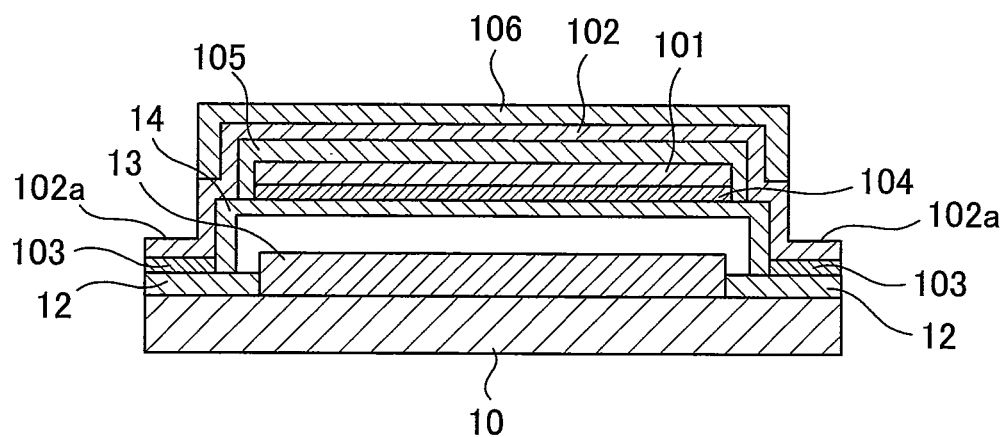
FIG. 21 is a cross-sectional view taken along the line B-B in FIG. 19.

FIG. 19 is a plan view of the organic EL illumination device according to the embodiment. FIG. 20 is a cross-sectional view taken along the line A-A in FIG. 19. FIG. 21 is a cross-sectional view taken along the line B-B in FIG. 19. Although omitted in FIGS. 19 to 21, power supply terminal portions are actually formed.

As shown in FIGS. 19 to 21, the organic EL illumination device of the embodiment includes an anode flexible printed circuit (hereinafter, referred to as FPC) board 101 being a FPC board on which an anode wiring pattern corresponding to four anode terminal electrodes 11 are formed to achieve uniform supply of power to the four anode terminal electrodes 11 and four cathode terminal electrodes 12. Anode FPC electrodes 101a are formed respectively in four sides of the anode FPC board 101. The specific structures of circuits, electrodes, and the like of the FPC board are similar to those of a conventional FPC board and description thereof is thus omitted herein.

The organic EL illumination device of the embodiment also includes a cathode FPC board 102 being a FPC board on which a cathode wiring pattern corresponding to the four cathode terminal electrodes 12 is formed. Cathode FPC electrodes 102a are formed respectively in four corners of the cathode FPC board 102.

In other words, the organic EL illumination device according to the embodiment is a can-sealed-type organic EL illumination device in which the anode FPC board 101 and the cathode FPC board 102 each cover almost an entire light-emitting surface of an organic EL element 13.

The anode wiring pattern and the cathode wiring pattern are formed respectively on the anode FPC board 101 and the cathode FPC board 102 with insulating members therebetween and both sides of each of the anode wiring pattern and the cathode wiring pattern are covered with insulating members. Moreover, an insulating material on the anode terminal electrodes 11 is removed in portions where the anode terminal electrodes 11 are to be connected to the anode FPC electrodes 101a. Similarly, an insulating material on the cathode terminal electrodes 12 is also removed in portions where the cathode terminal electrodes 12 are to be connected to the cathode FPC electrodes 102a.

Moreover, an insulating material on the power supply terminal portions for supplying a current is removed as a matter of course. Copper which has a low resistance is generally used as a wiring material and portions where the copper is exposed are plated with gold or solder.

Furthermore, in the embodiment, the organic EL illumination device includes four anode terminal electrodes 11 and four cathode terminal electrodes 12 to evenly supply a current to the organic EL element formed in a rectangular shape. Hence, four anode FPC electrodes 101a are formed in the anode FPC board 101 and four cathode FPC electrodes 102a are formed in the cathode FPC board 102. However, when the organic EL illumination device includes three anode terminal electrodes 11 and three cathode terminal electrodes 12 to evenly supply a current to an organic EL element formed in a triangular shape for example, three anode FPC electrodes 101a and three cathode FPC electrodes 102a may be formed in the anode FPC board 101 and the cathode FPC board 102.

Moreover, when the organic EL illumination device includes five or more anode terminal electrodes 11 and five or more cathode terminal electrodes 12 to evenly supply a current to an organic EL element formed in a polygonal shape whose number of sides is equal to or more than that of a pentagon, five or more anode FPC electrodes 101a and five or more cathode FPC electrodes 102a may be formed in the anode FPC board 101 and the cathode FPC board 102.

Next, description is given of the structure of the organic EL illumination device according to the embodiment in the cross section taken along the line A-A shown in FIG. 19.

As shown in FIGS. 19 and 20, in the organic EL illumination device of the embodiment, the anode terminal electrodes 11 are formed on the glass substrate 10. The organic EL element 13 is formed on the anode terminal electrodes 11 in a center portion. Moreover, an anisotropic conductive film (hereinafter, referred to as ACF) 103 is attached onto the anode terminal electrodes 11 in both end portions. Moreover, a sealing can 14 configured to seal the organic EL element 13 is formed on the anode terminal electrodes 11.

A lower insulating film 104 is formed on the sealing can 14. A film of polyimide or the like is used for the lower insulating film 104 in the embodiment. The anode FPC board 101 is provided on the lower insulating film 104, the sealing can 14, and the ACE 103.

The anode FPC electrodes 101a of the anode FPC board 101 and the ACF 103 are connected by a thermo compression bonding method using an ACF compression bonding apparatus. The anode FPC electrodes 101a and the anode terminal electrodes 11 are thus electrically connected together. In the embodiment, although the ACF 103 is used to connect the anode FPC electrodes 101a and the anode terminal electrodes 11, a material such as solder, silver paste, or a conductive film can be also used. Moreover, the material is not limited to those described above and any material can be used as long as the electrical connection can be achieved.

An inter-layer insulating film 105 is formed on the anode FPC board 101. The cathode FPC board 102 is provided on the inter-layer insulating film 105. In other words, the inter-layer insulating film 105 has a function of insulating the anode FPC board 101 and the cathode FPC board 102 from each other. In the embodiment, the inter-layer insulating film 105 is made of a film of polyimide or the like as well as an acrylic resin film, thermosetting epoxy resin film, or the like used to bond the anode FPC board 101 and the cathode FPC board 102. An upper insulating film 106 is formed on the cathode FPC board 102.

This is the structure of the organic EL illumination device according to the embodiment in the cross section taken along the line A-A shown in FIG. 19.

Next, description is given of the structure of the organic EL illumination device according to the embodiment in the cross section taken along the line B-B shown in FIG. 19.

As shown in FIGS. 19 and 21, in the organic EL illumination device of the embodiment, the organic EL element 13 is formed on the glass substrate 10 in the center portion. Moreover, the cathode terminal electrodes 12 are formed on the glass substrate 10, on both sides of the organic EL element 13. The ACF 103 is attached onto the cathode terminal electrodes 12. Moreover, the sealing can 14 configured to seal the organic EL element 13 is formed on the cathode terminal electrodes 12.

The lower insulating film 104 is formed on the sealing can 14. The anode FPC board 101 is provided on the lower insulating film 104. The inter-layer insulating film 105 is formed on the sealing can 14 and the anode FPC board 101. The cathode ETC board 102 is provided above the inter-layer insulating film 105, the sealing can 14, and the ACF 103. The cathode FPC electrodes 102a of the cathode ETC board 102 and the ACF 103 are connected by the thermo compression bonding method using the ACF compression bonding apparatus. The cathode FPC electrodes 102a and the cathode terminal electrodes 12 are thus electrically connected together. The upper insulating film 106 is formed on the cathode FPC board 102.

That is the structure of the organic EL illumination device of the embodiment in the cross section taken along the line B-B shown in FIG. 19.

In the conventional organic EL illumination device, connection of the four anode terminal electrodes 11 and the four cathode terminal electrodes 12 requires connection of total of eight lead wires, i.e., four for the anode terminal electrodes 11 and four for the cathode terminal electrodes 12. This connection work is performed with a soldering iron by hand work at 16 portions at ends of the eight lead wires.

On the other hand, in the organic EL illumination device of the embodiment, the anode FPC board 101 and the cathode FPC board 102 are used for wiring. Hence, after the ACF 103 is attached by using an automatic machine, wiring can be achieved by use of the anode FPC board 101 and the cathode FPC board 102. Accordingly, the yield and the productivity can be improved.

Further, in the conventional organic EL illumination device, the following method is used to reduce the wiring resistance and the unevenness of luminance. The top of the upper electrode in contact with the organic EL element is covered with a thin insulating sheet (for example 100 nm to 1000 nm) and an insulating film with a conductive sheet is formed on the insulating sheet. However, since the insulting sheet is thin, short circuit occurs due to a conductive foreign object or the like and this reduces the yield.

On the other hand, in the organic EL illumination device of the embodiment, the anode FPC board 101 and the cathode FPC board 102 are used to run the wirings above the sealing can 14. Accordingly, no short circuit occurs between the wirings and electrodes formed in the organic EL element 13, and the yield can be thus drastically improved.

Embodiment 9

Description is given below of an organic EL illumination device according to a ninth embodiment of the present invention.

Figure 22:
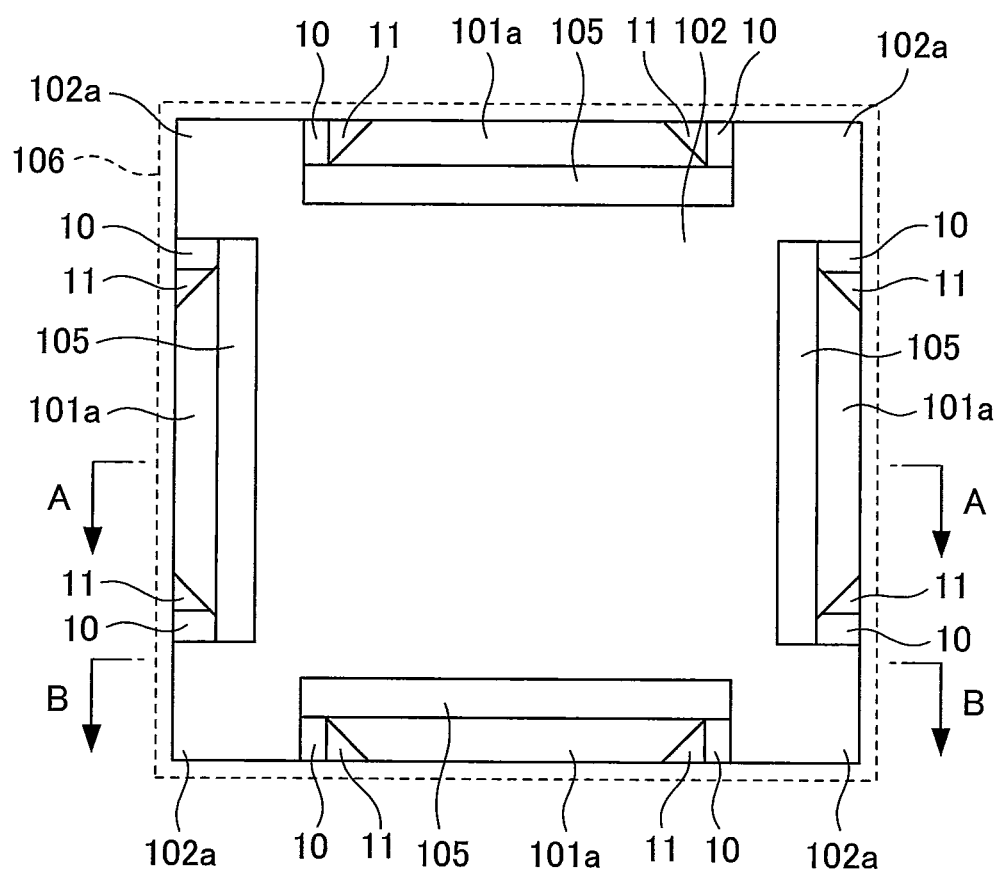
FIG. 22 is a plan view of an organic EL illumination device according to a ninth embodiment of the present invention.
Figure 23:
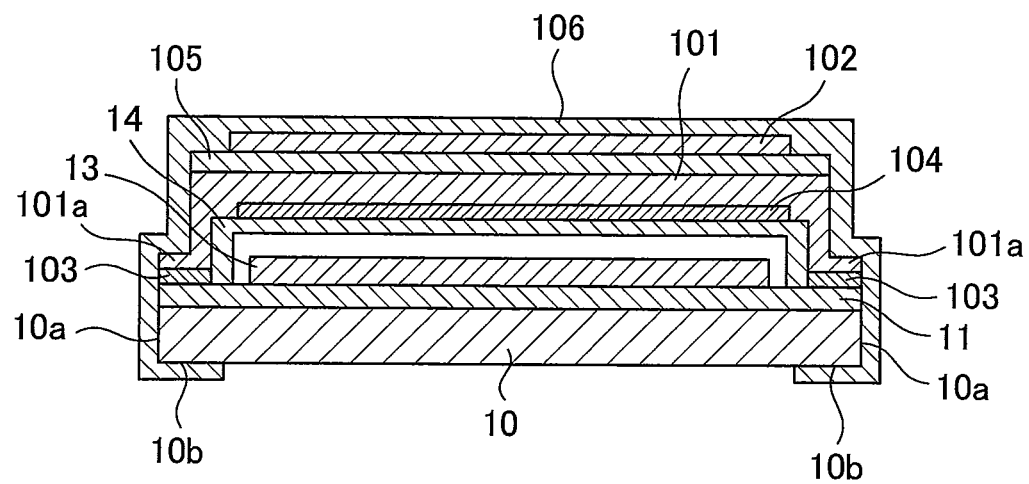
FIG. 23 is a cross-sectional view taken along the line A-A in FIG. 22.
Figure 24:
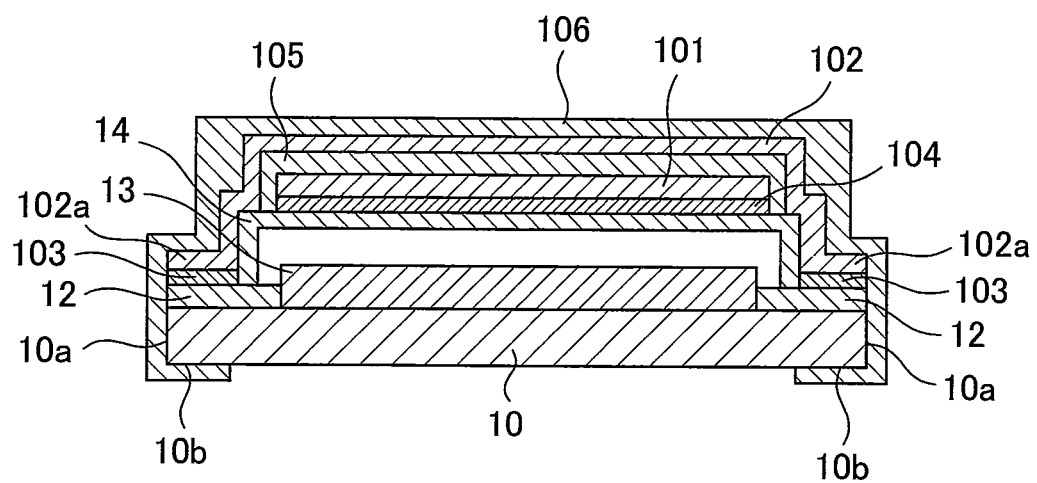
FIG. 24 is a cross-sectional view taken along the line B-B in FIG. 22.

FIG. 22 is a plan view of the organic EL illumination device according to the embodiment. FIG. 23 is a cross-sectional view taken along the line A-A in FIG. 22. FIG. 24 is a cross-sectional view taken along the line B-B in FIG. 22.

Although omitted in FIGS. 22 to 24, power supply terminal portions are actually formed. Moreover, an upper insulating film 106 is illustrated by a broken line in FIG. 22.

The structure of the organic EL illumination device according to the embodiment is almost the same as the structure of the organic EL illumination device according to the eighth embodiment but, as shown in FIGS. 22 to 24, is different in that the upper insulating film 106 covers surfaces of anode terminal electrodes 11 and cathode terminal electrodes 12 as well as a side surface 10a and a back surface end portion 10b of a glass substrate 10.

An adhesive is used to bond the upper insulating film 106 with the anode terminal electrodes 11, the cathode terminal electrodes 12, and the glass substrate 10. In the embodiment, a solid adhesive is used as the adhesive. Moreover, when a liquid adhesive or a film adhesive made of an acrylic resin, an epoxy resin, or the like is used, the adhesive may be applied by using a dispenser or may be printed by screen printing, which enables uniform application of the adhesive on surfaces. Furthermore, a gel adhesive film may be used.

In a wiring connection method of the conventional organic EL illumination device in which soldering using lead wires is performed, the anode terminal electrodes 11, the cathode terminal electrodes 12, lead wire connection portions, and end surfaces of the glass substrate 10 are exposed. Hence, there is a safety problem that a worker may be injured by having his/her hand cut or receive an electric shock when holding the organic EL illumination device.

Meanwhile, the organic EL illumination device of the embodiment has the following effect in addition to the effects of the organic EL illumination device according to the eighth embodiment. The safety can be improved by covering the surfaces of the anode terminal electrodes 11 and the cathode terminal electrodes 12 as well as the side surface 10a and the back surface end portion 10b of the glass substrate 10 with the upper insulating film 106.

Embodiment 10

Description is given below of an organic EL illumination device according to a tenth embodiment of the present invention.

Figure 25:
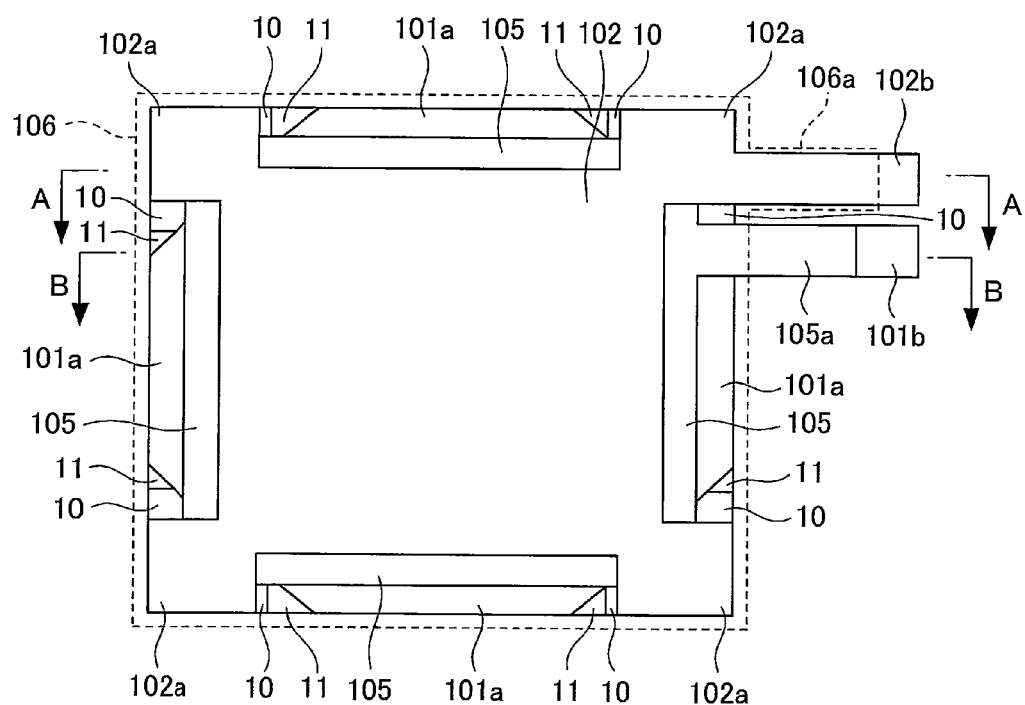
FIG. 25 is a plan view of an organic EL illumination device according to a tenth embodiment of the present invention.
Figure 26:
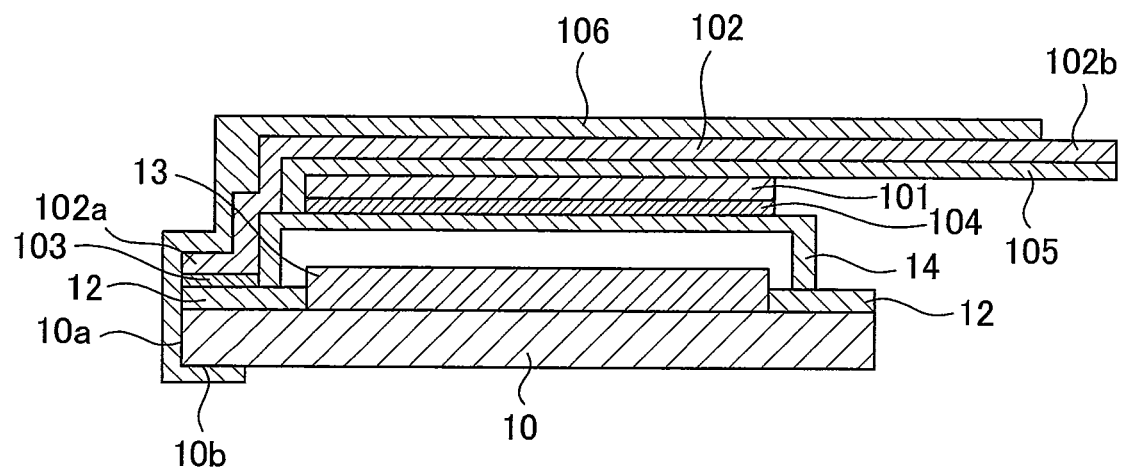
FIG. 26 is a cross-sectional view taken along the line A-A in FIG. 25.
Figure 27:
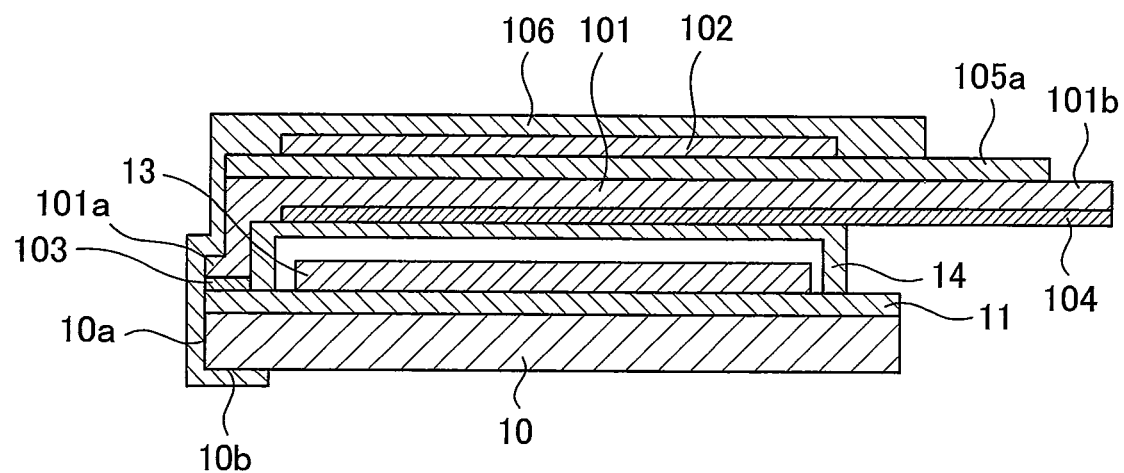
FIG. 27 is a cross-sectional view taken along the line B-B in FIG. 25.

FIG. 25 is a plan view of the organic EL illumination device according to the embodiment. FIG. 26 is a cross-sectional view taken along the line A-A in FIG. 25. FIG. 27 is a cross-sectional view taken along the line B-B in FIG. 25.

Although omitted in FIGS. 25 to 27, a connector is actually attached. Moreover, an upper insulating film 106 is illustrated by a broken line in FIG. 25.

The structure of the organic EL illumination device according to the embodiment is almost the same as the structure of the organic EL illumination device according to the ninth embodiment but is different in the following point. As shown in FIGS. 25 to 27, wirings patterns of an anode FPC board 101 and a cathode FPC board 102 are changed in such a way that an anode FPC power supply terminal portion 101b protruding beyond one of anode terminal electrodes is formed in one of anode FPC electrodes 101a of the anode FPC board 101 and that a cathode FPC power supply terminal portion 102b protruding beyond one of cathode terminal electrodes 12 is formed in one of cathode FPC electrodes 102a of the cathode FPC board 102.

This allows connector 24 to be directly connected to the anode FPC power supply terminal portion 101b and the cathode FPC power supply terminal portion 102b without using the anode lead-out wire 22 and the cathode lead-out wire 23 which are illustrated in FIG. 42. Note that an upper portion of the anode FPC power supply terminal portion 101b is covered with a protruding portion 105a of an inter-layer insulating film 105 and an upper portion of the cathode FPC power supply terminal portion 102b is covered with a protruding portion 106a of an upper insulating film 106.

Assume a case in the conventional organic EL illumination device where lead wires having an external diameter of 1.3 mm are lead out respectively from one of the four anode terminal electrodes 11 and one of the four cathode terminal electrodes 12. In this case, when the height of the sealing can 14 is 1 mm or less, the lead wires protrude by 0.3 mm or more and the organic EL illumination device thus cannot be made sufficiently thin.

Meanwhile, the organic EL illumination device of the embodiment has the following effect in addition to the effects of the organic EL illumination device according to the eighth embodiment. The lead wires can be omitted by changing the patterns of the anode FPC board 101 and the cathode FPC board 102 in such a way that the anode FPC power supply terminal portion 101b and the cathode FPC power supply terminal portion 102b protrude beyond the corresponding anode terminal electrode 11 and the corresponding cathode terminal electrode 12. Hence, it is possible to make the organic EL illumination device thin and a frame thereof narrow. Moreover, since easy connection using the connector 24 can be performed, it is possible to improve productivity and simplify manufacturing steps.

Embodiment 11

Description is given below of an organic EL illumination device according to an eleventh embodiment of the present invention.

Figure 28:
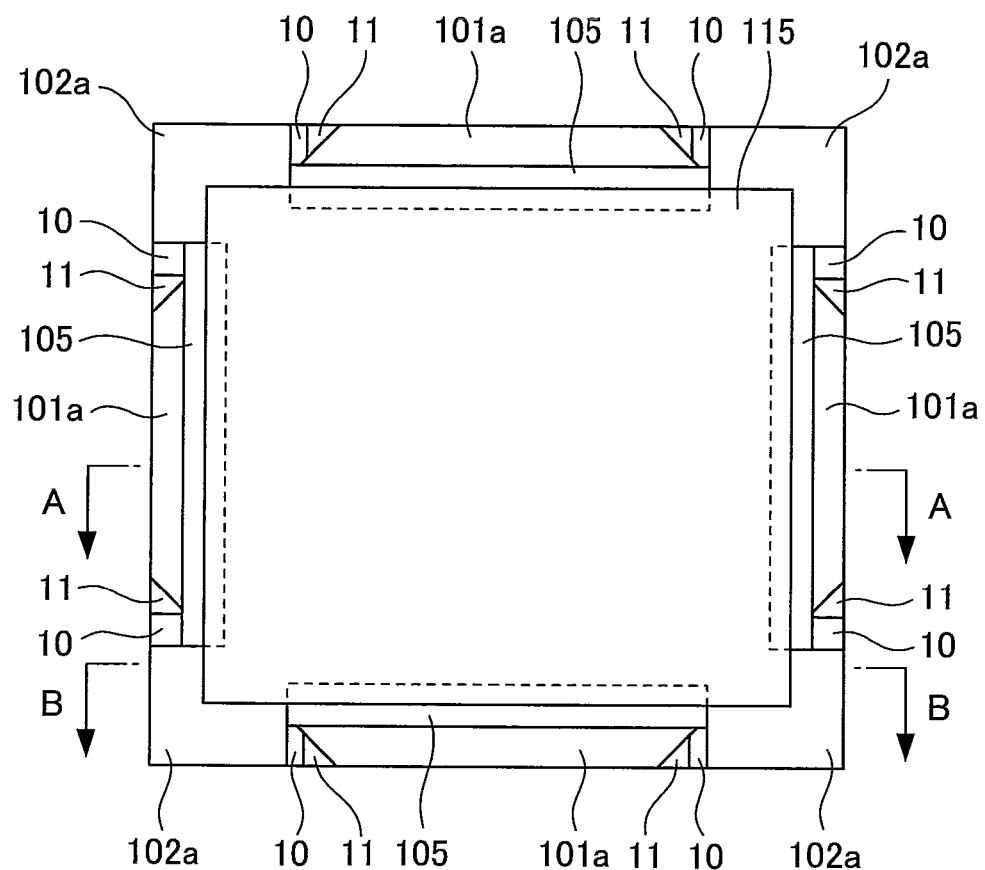
FIG. 28 is a plan view of an organic EL illumination device according to an eleventh embodiment of the present invention.
Figure 29:
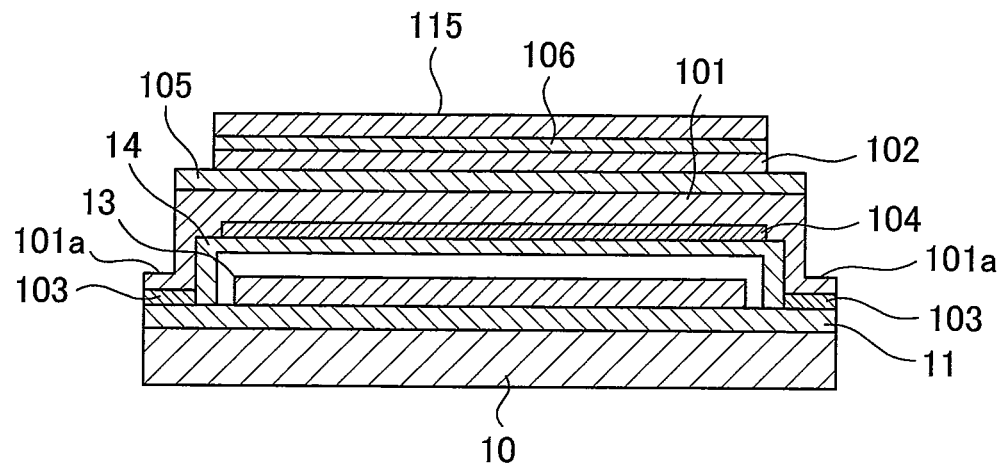
FIG. 29 is a cross-sectional view taken along the line A-A in FIG. 28.
Figure 30:
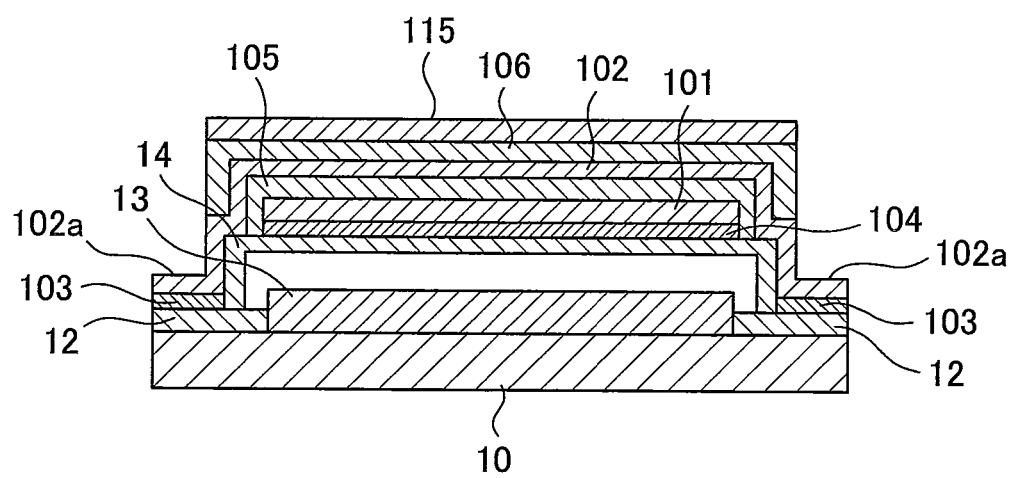
FIG. 30 is a cross-sectional view taken along the line B-B in FIG. 28.

FIG. 28 is a plan view of the organic EL illumination device according to the embodiment. FIG. 29 is a cross-sectional view taken along the line A-A in FIG. 28. FIG. 30 is a cross-sectional view taken along the line B-B in FIG. 28. Although omitted in FIGS. 28 to 30, power supply terminal portions are actually formed.

The structure of the organic EL illumination device according to the embodiment is almost the same as the structure of the organic EL illumination device according to the eighth embodiment but, as shown in FIGS. 28 to 30, is different in that a plate 115 for uniform heat distribution and radiation is installed on an upper portion of an upper insulating film 106. In the embodiment, a material with good thermal conductivity such as aluminum, copper, ceramic, graphite sheet, or the like is used as the material of the plate 115 for uniform heat distribution and radiation. However, other materials with good thermal conductivity can be used.

Moreover, in the embodiment, the plate 115 for uniform heat distribution and radiation is installed on the upper portion of the upper insulating film 106. However, the plate 115 for uniform heat distribution and radiation may be installed between an anode FPC board 101 and a lower insulating film 104 or may be installed in both of the positions described above. Furthermore, in the embodiment, the plate 115 for uniform heat distribution and radiation on the upper portion of the upper insulating film 106 has a single layer structure. However, the plate 115 for uniform heat distribution and radiation may have a multilayer structure. In the case of employing the multilayer structure, the layers are attached together by using an acrylic resin film, a thermosetting epoxy resin film, or a liquid adhesive.

The organic EL illumination device according to the embodiment thus has the following effect in addition to the effects of the organic EL illumination device according to the eighth embodiment. Heat generated in an organic EL element 13 is uniformly distributed and uniform distribution of the heat in the entire organic EL element 13 is achieved. This improves the light emission distribution in a surface of the organic EL element 13.

Embodiment 12

Description is given below of an organic EL illumination device according to a twelfth embodiment of the present invention.

Figure 31:
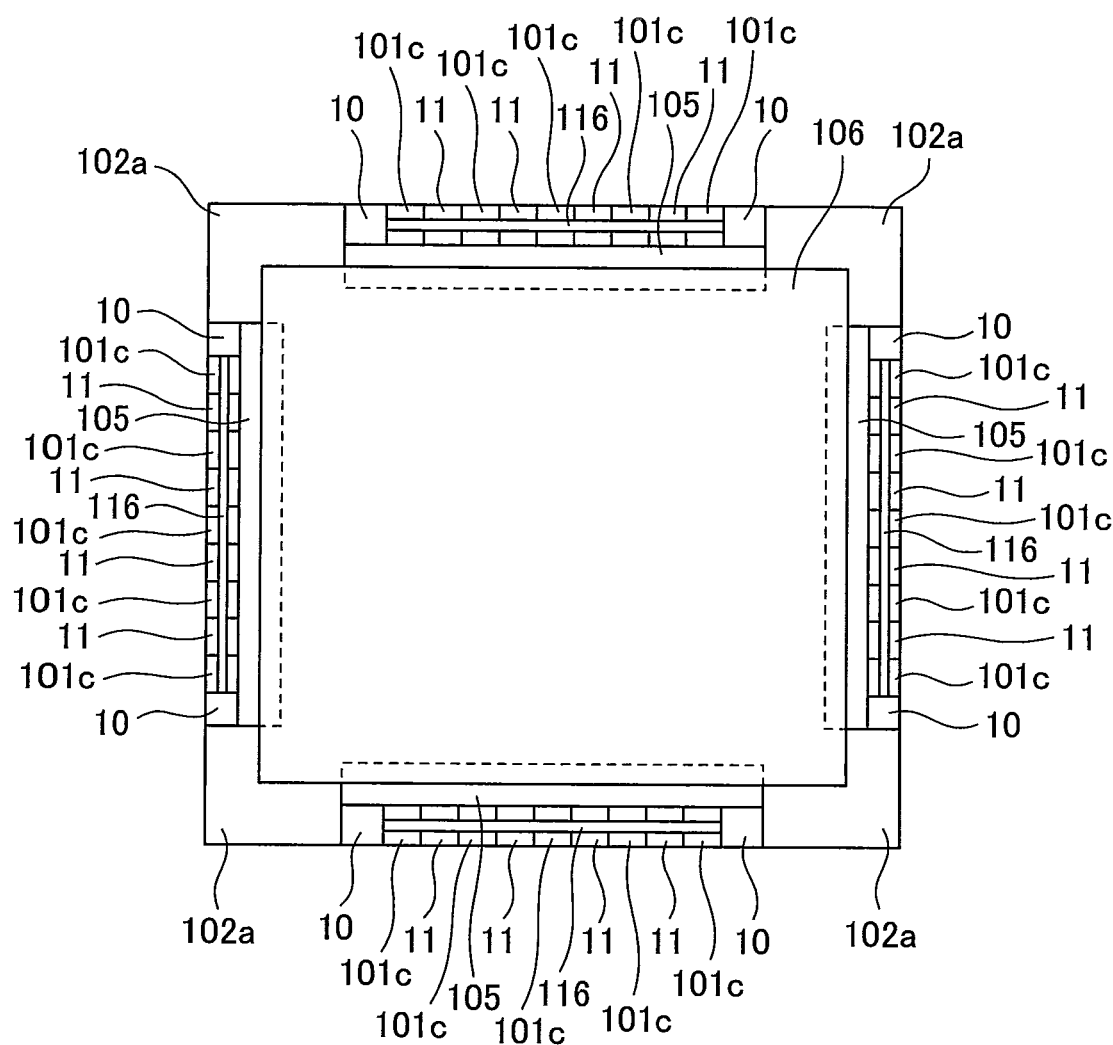
FIG. 31 is a plan view of an organic EL illumination device according to a twelfth embodiment of the present invention.

FIG. 31 is a plan view of the organic EL illumination device according to the embodiment. Although omitted in FIG. 31, power supply terminal portions are actually formed.

The structure of the organic EL illumination device according to the embodiment is almost the same as the structure of the organic EL illumination device according to the eighth embodiment but is different in the following point. As shown in FIG. 31, anode FPC electrodes 101a are formed in a shape of strips as strip-shaped anode FPC electrodes 101c. Then, soldering is performed from above the strip-shaped anode FPC electrodes 101c by using solder 116 to electrically connect the anode FPC electrodes 101a and the anode terminal electrodes 11. In the embodiment, description is given of the anode FPC electrodes 101a. However, cathode FPC electrodes 102a may also be formed in a shape of strips and be electrically connected to cathode terminal electrodes 12 by using the solder.

In addition to the effects of the organic EL illumination device according to the eighth embodiment, the organic EL illumination device according to the embodiment thus has such an effect that the strip-shaped anode FPC electrodes 101c allows easy connection of the anode FPC electrodes 101a and the anode terminal electrodes 11 by using the solder.

Embodiment 13

Description is given below of an organic EL illumination device according to a thirteenth embodiment of the present invention.

Figure 32:
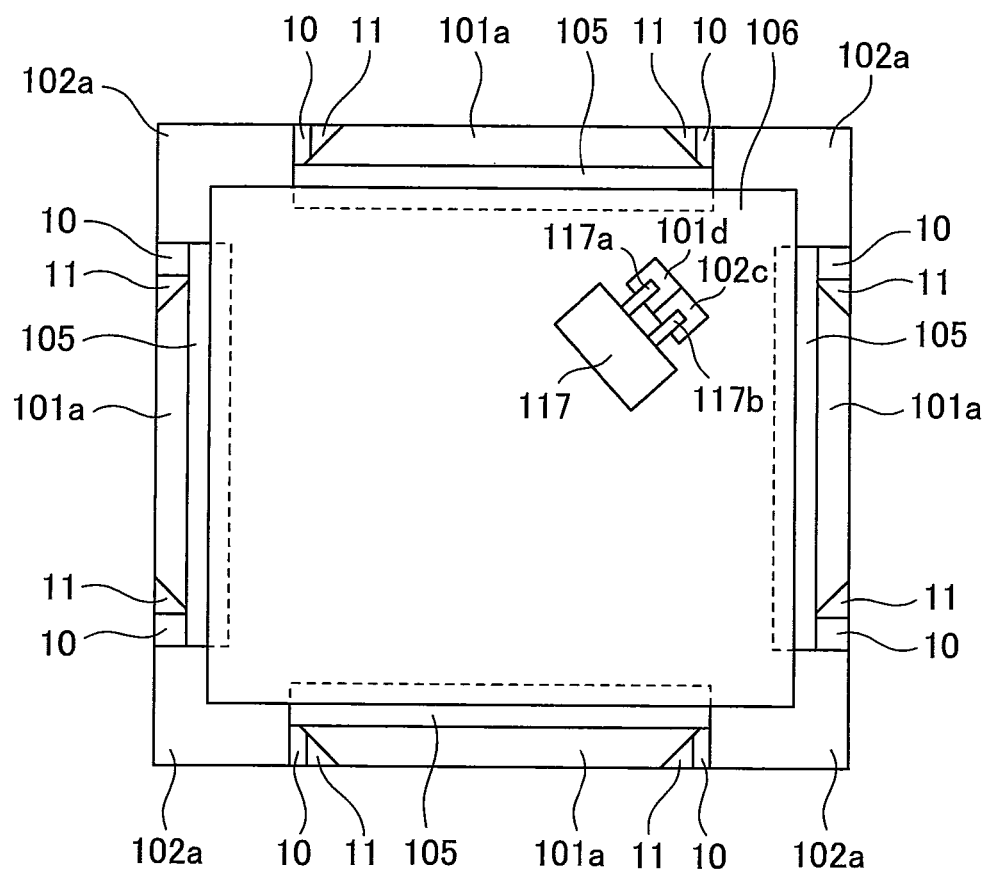
FIG. 32 is a plan view of an organic EL illumination device according to a thirteenth embodiment of the present invention.

FIG. 32 is a plan view of the organic EL illumination device according to the embodiment. Although omitted in FIG. 32, power supply terminal portions are actually formed.

The structure of the organic EL illumination device according to the embodiment is almost the same as the structure of the organic EL illumination device according to the eighth embodiment but is different in the following point. As shown in FIG. 32, a connector 117 is installed on an upper insulating film 106 located in a portion where an anode FPC board 101 and an cathode FPC board 102 are stacked. The upper insulating film 106, the cathode FPC board 102, and an inter-layer insulating film 105 are partially removed and an anode terminal 117a of the connector 117 is then connected to an anode extracting portion 101d formed in the anode FPC board 101. Moreover, the upper insulating film 106 is partially removed and a cathode terminal 117b of the connector 117 is then connected to a cathode extracting portion 102c formed in the cathode FPC board 102.

Assume a case in the conventional organic EL illumination device where lead wires having an external diameter of 1.3 mm φ are lead out respectively from one of the four anode terminal electrodes 11 and one of the four cathode terminal electrodes 12. In this case, when the height of a sealing can 14 is 1 mm or less, the lead wires protrude by 0.3 mm or more and the organic EL illumination device cannot be made sufficiently thin.

Meanwhile, the organic EL illumination device of the embodiment has the following effect in addition to the effects of the organic EL illumination device according to the eighth embodiment. The lead wires can be omitted by installing the connector 117 on the upper insulating film 106. Hence, it is possible to make the organic EL illumination device thin and a frame thereof narrow. Moreover, since easy connection using the connector 117 can be performed, it is possible to improve productivity and simplify manufacturing steps.

Embodiment 14

Description is given below of an organic EL illumination device according to a fourteenth embodiment of the present invention.

Figure 33:
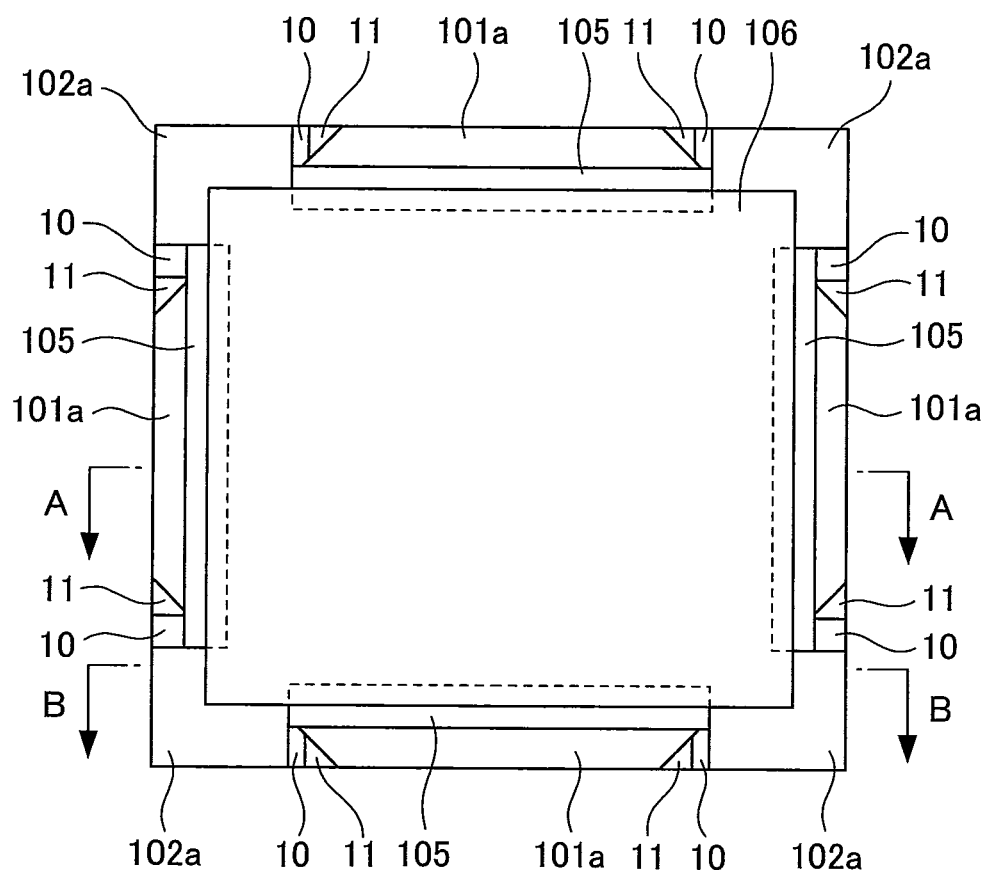
FIG. 33 is a plan view of an organic EL illumination device according to a fourteenth embodiment of the present invention.
Figure 34:
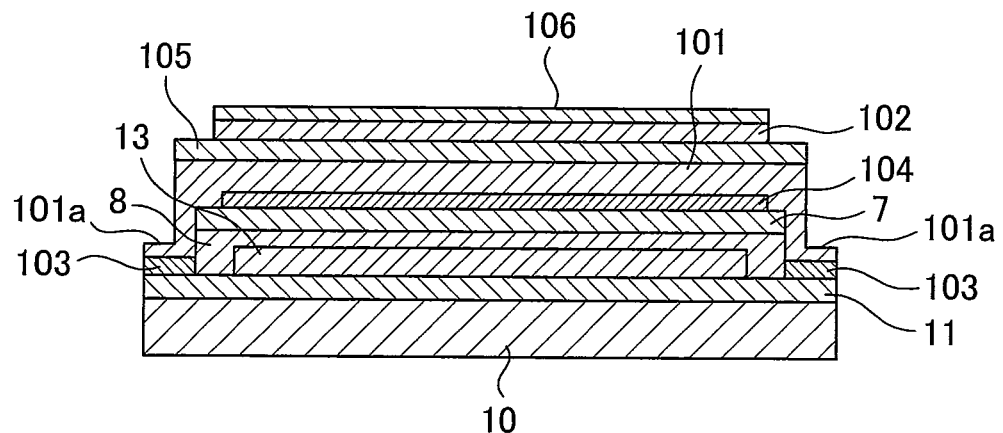
FIG. 34 is a cross-sectional view taken along the line A-A in FIG. 33.
Figure 35:
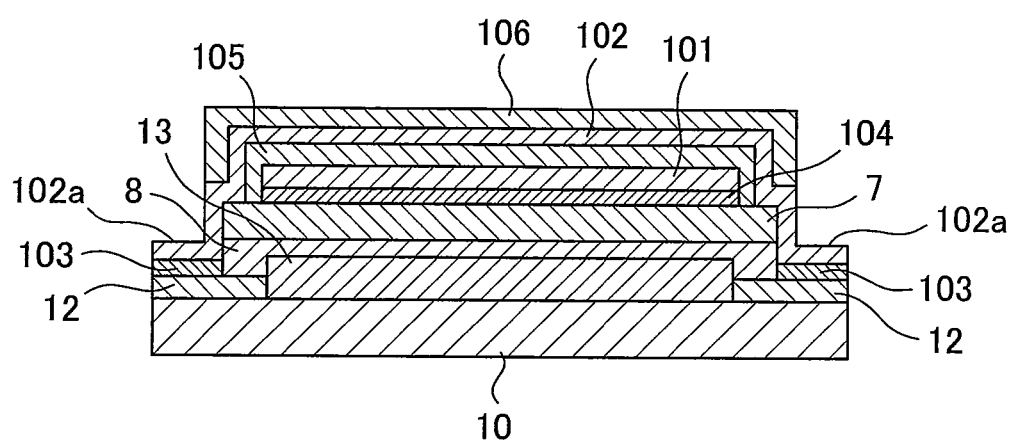
FIG. 35 is a cross-sectional view taken along the line B-B in FIG. 33.

FIG. 33 is a plan view of the organic EL illumination device according to the embodiment. FIG. 34 is a cross-sectional view taken along the line A-A in FIG. 33. FIG. 35 is a cross-sectional view taken along the line B-B in FIG. 33. Although omitted in FIGS. 33 to 35, power supply terminal portions are actually formed.

The structure of the organic EL illumination device according to the embodiment is almost the same as the structure of the organic EL illumination device according to the eighth embodiment but is different in the following point. As shown in FIGS. 33 and 35, instead of a sealing can 14, a sealing glass substrate 7 for preventing performance deterioration of an organic EL element 13 due to oxygen, water, and the like is bonded to a glass substrate 10 with an adhesive layer 8 and the organic EL element 13 is thus sealed.

In the embodiment, a solid seal using a resin for the adhesive layer 8 is employed as an example. However, a gel seal using gels for the adhesive layer 8 may be employed. In the case of the gel seal, the glass substrate 10 and the sealing glass substrate 7 have to be fixed together with an adhesive to prevent the gels from flowing out. Moreover, although the sealing glass substrate 7 is used as a sealing substrate in the embodiment, a substrate made of a material such as a plastic, metal, ceramic, or the like can be also used as the sealing substrate.

In addition, like the organic EL illumination device according to the ninth embodiment, the organic EL illumination device according to the embodiment may be configured such that an upper insulating film 106 covers surfaces of anode terminal electrodes 11 and cathode terminal electrodes 12 as well as a side surface 10a and a back surface end portion 10b of the glass substrate 10.

Moreover, like the organic EL illumination device according to the tenth embodiment, wiring patterns of an anode FPC board 101 and a cathode FPC board 102 may be changed in such a way that an anode FPC power supply terminal portion 101b protruding beyond one of the anode terminal electrodes is formed in one of anode FPC electrodes 101a of an anode FPC board 101 and that a cathode FPC power supply terminal portion 102b protruding beyond one of the cathode terminal electrodes 12 is formed in one of cathode FPC electrodes 102a of a cathode FPC board 102.

In the conventional organic EL illumination device disclosed in Patent Document 2 described above, the auxiliary wiring is formed directly on the protective film on the upper electrode. Hence, when a conductive foreign object or the like exists on the protective film, the protective film is destroyed and the possibility of short circuit between the cathode and the anode ITO becomes very high.

Meanwhile, the organic EL illumination device of the embodiment has the following effect in addition to the advantageous effects of the organic EL illumination device according to the eighth embodiment. The sealing glass substrate 7 and the adhesive layer 8 are provided under the anode FPC board 101. This prevents a short circuit between the anode FPC board 101 and the cathode terminal electrodes 12. Accordingly, decrease in yield can be suppressed.

Embodiment 15

Description is given below of an organic EL illumination device according to a fifteenth embodiment of the present invention.

Figure 36:
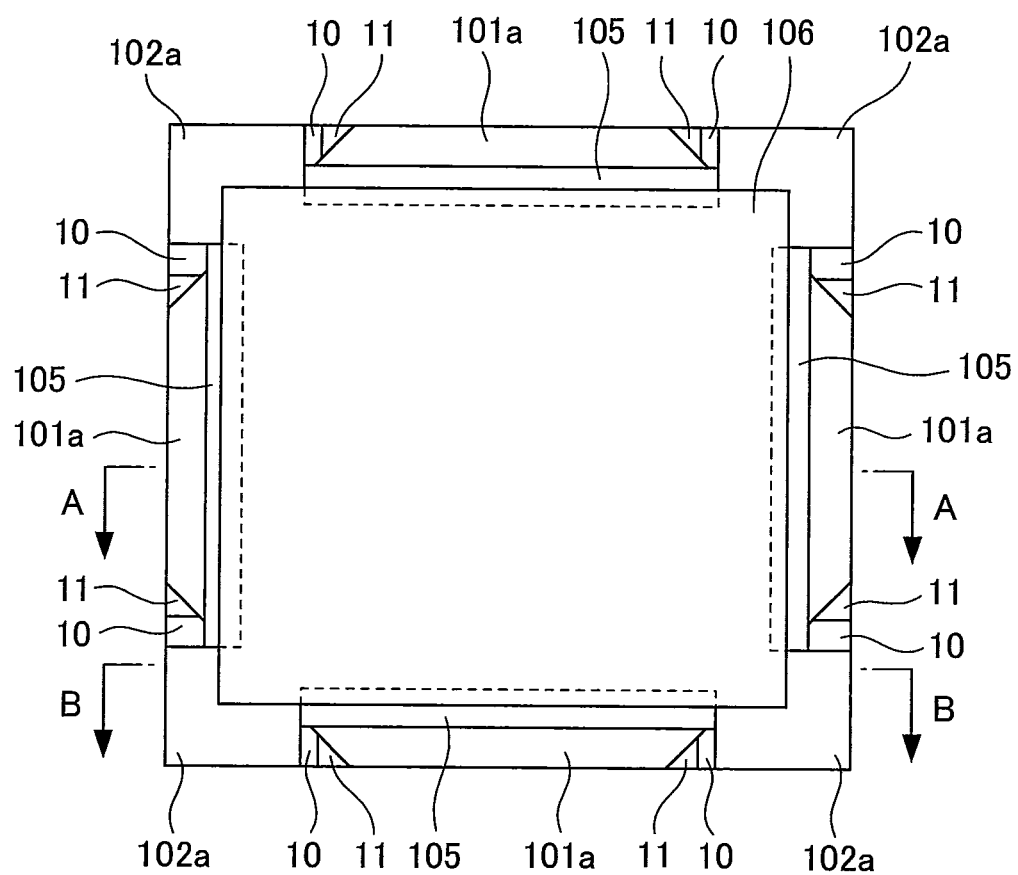
FIG. 36 is a plan view of an organic EL illumination device according to a fifteenth embodiment of the present invention.
Figure 37:
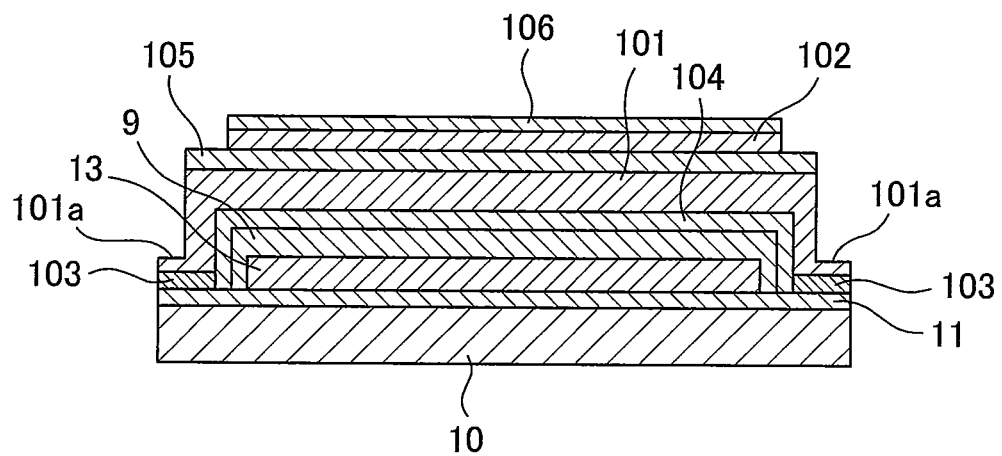
FIG. 37 is a cross-sectional view taken along the line A-A in FIG. 36.
Figure 38:
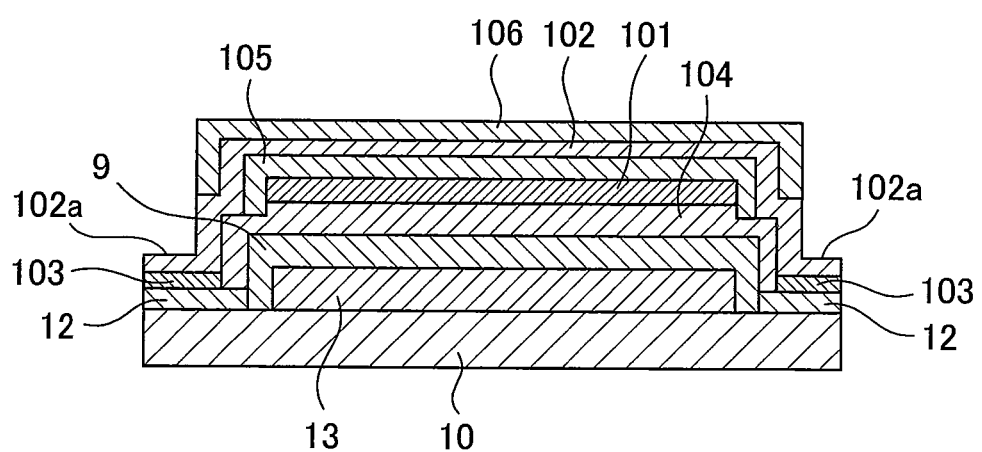
FIG. 38 is a cross-sectional view taken along the line B-B in FIG. 36.

FIG. 36 is a plan view of the organic EL illumination device according to the embodiment. FIG. 37 is a cross-sectional view taken along the line A-A in FIG. 36. FIG. 38 is a cross-sectional view taken along the line B-B in FIG. 36. Although omitted in FIGS. 36 to 38, power supply terminal portions are actually formed.

The structure of the organic EL illumination device according to the embodiment is almost the same as the structure of the organic EL illumination device according to the eighth embodiment but is different in the following point. As shown in FIGS. 36 to 38, a sealing film 9 for preventing performance deterioration of an organic EL element 13 due to oxygen, water, and the like is formed instead of the sealing can 14 and the organic EL element 13 is thus sealed.

In addition, like the organic EL illumination device according to the ninth embodiment, the organic EL illumination device according to the embodiment may be configured such that an upper insulating film 106 covers surfaces of anode terminal electrodes 11 and cathode terminal electrodes 12 as well as a side surface 10a and a back surface end portion 10b of a glass substrate 10.

Moreover, like the organic EL illumination device according to the tenth embodiment, wiring patterns of an anode FPC board 101 and a cathode FPC board 102 may be changed in such a way that an anode FPC power supply terminal portion 101b protruding beyond one of the anode terminal electrodes is formed in one of anode FPC electrodes 101a of an anode FPC board 101 and that a cathode FPC power supply terminal portion 102b protruding beyond one of the cathode terminal electrodes 12 is formed in one of cathode FPC electrodes 102a of a cathode FPC board 102.

In the conventional organic EL illumination device disclosed in Patent Document 2 described above, the auxiliary wiring is formed directly on the protective film on the upper electrode. Hence, when a conductive foreign object or the like exists on the protective film, the protective film is destroyed and the possibility of short circuit between the cathode and the anode ITO becomes very high.

Meanwhile, in the organic EL illumination device of the embodiment, the thick sealing film 9, which is made of, for example, a polyimide film of about 10 µm and an adhesive of about 20 µm, is formed under the anode FPC board 101. This prevents short circuit between the anode FPC board 101 and the cathode terminal electrodes 12. Accordingly, decrease in yield can be suppressed.

The embodiments of the organic EL illumination device according to the present invention have been described above. However, the present invention can be carried out by appropriately combining the configurations shown in the embodiments.

INDUSTRIAL APPLICABILITY

The present invention can be used in an organic EL illumination device including an organic EL illumination panel with a large area for example.

EXPLANATION OF THE REFERENCE NUMERALS 1 wiring board
1a anode wiring
1b cathode wiring
1c anode electrode
1d cathode electrode
1e anode connection wiring
1f cathode connection wiring
2 L-shaped wiring board
2a anode electrode
2b cathode electrode
2c anode connection wiring
2d cathode connection wiring
3 L-shaped connection wiring board
3a anode wiring
3b cathode wiring electrode
3c anode electrode
3d anode connection wiring
4 protruding portion
4a anode power supply terminal portion
4b cathode power supply terminal portion
5 resin frame
6 plate for uniform heat distribution and radiation
7 sealing glass substrate
8 adhesive layer
9 sealing film
10 glass substrate
11 anode terminal electrode
12 cathode terminal electrode
13 organic EL element
14 sealing can
20 anode lead wire
21 cathode lead wire
22 anode lead-out wire
23 cathode lead-out wire
24 connector
101 anode FPC board
101a anode FPC electrode
101b anode FPC power supply terminal portion
101c strip-shaped anode FPC electrode
101d anode extracting portion
102 cathode FPC board
102a cathode FPC electrode
102b cathode FPC power supply terminal portion
102c cathode extracting portion
103 anisotropic conductive film (ACF)
104 lower insulating film
105 inter-layer insulating film
105a protruding portion
106 upper insulating film
106a protruding portion
115 plate for uniform heat distribution and radiation
116 solder
117 connector
117a anode terminal
117b cathode terminal

The invention claimed is:

1. An organic EL illumination device including an organic EL element, a plurality of anode terminal electrodes, and a plurality of cathode terminal electrodes on a glass substrate, the anode terminal electrodes and the cathode terminal electrodes used to evenly supply a current to the organic EL element, characterized in that the organic EL element has a polygonal shape,
the numbers of the anode terminal electrodes and the cathode terminal electrodes are the same as the number of corners of the organic EL element,
the anode terminal electrodes and the cathode terminal electrodes are alternately arranged along an outer periphery of the organic El element while being spaced away from one another, a length of a portion of each of the anode terminal electrodes facing the outer periphery of the organic EL element is longer than a length of a portion of each of the cathode terminal electrodes facing the outer periphery of the organic EL element, and the organic EL illumination device comprises a wiring board in which a circuit having anode electrodes corresponding to positions of the respective anode terminal electrodes and a circuit having cathode electrodes corresponding to positions of the respective cathode terminal electrodes are formed.

2. The organic EL illumination device according to claim 1, characterized in that the wiring board is formed to surround part or an entirety of the organic EL element.

3. The organic EL illumination device according to claim 2, characterized in that the organic EL illumination device further comprises a plate for uniform heat distribution and radiation on a back surface thereof, and an outer periphery of the plate for uniform heat distribution and radiation is larger than an outer periphery of the glass substrate.

4. The organic EL illumination device according to claim 2, characterized in that an outer periphery of the wiring board is larger than an outer periphery of the glass substrate.

5. The organic EL illumination device according to claim 2, characterized in that a power supply terminal portion for supplying a current to the wiring board is formed.

6. The organic EL illumination device according to claim 2, characterized in that a resin frame is placed around the substrate.

7. The organic EL illumination device according to claim 1, characterized in that the wiring board includes:

an anode flexible printed circuit board in which a circuit having electrodes corresponding to positions of the respective anode terminal electrodes is formed: and a cathode flexible printed circuit board in which a circuit having electrodes corresponding to positions of the respective cathode terminal electrodes is formed: and an inter-layer insulating layer which is formed between the anode flexible printed circuit board and the cathode flexible printed circuit board and which insulates the anode flexible printed circuit board and the cathode flexible printed circuit board from each other.

8. The organic EL illumination device according to claim 7, characterized in that a side surface and a back-surface end portion of the glass substrate is covered with an insulating film.

9. The organic EL illumination device according to claim 7, characterized in that a power supply terminal portion for supplying a current to the anode flexible printed circuit board and the cathode flexible printed circuit board is formed.

10. The organic EL illumination device according to claim 7, characterized in that the organic EL illumination device further comprises a plate for uniform heat distribution and radiation on a back surface thereof.

11. The organic EL illumination device according to claim 1, characterized in that the organic EL element is sealed with a sealing can.

12. The organic EL illumination device according to claim 1, characterized in that the organic EL element is sealed with a sealing glass substrate.

13. The organic EL illumination device according to claim 1, characterized in that the organic EL element is sealed with a sealing film.

* * * * *